(12) United States Patent
Wang et al.

(10) Patent No.: US 12,009,259 B2
(45) Date of Patent: Jun. 11, 2024

(54) SEMICONDUCTOR DEVICES INCLUDING LOW-K METAL GATE ISOLATION AND METHODS OF FABRICATION THEREOF

(71) Applicant: TAIWAN SEMICONDUCTOR MANUFACTURING COMPANY, LTD., Hsinchu (TW)

(72) Inventors: Sheng-Tsung Wang, Hsinchu (TW); Chia-Hao Chang, Hsinchu (TW); Lin-Yu Huang, Hsinchu (TW); Cheng-Chi Chuang, New Taipei (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 249 days.

(21) Appl. No.: 17/460,405

(22) Filed: Aug. 30, 2021

(65) Prior Publication Data
US 2023/0066705 A1 Mar. 2, 2023

(51) Int. Cl.
*H01L 21/768* (2006.01)
*H01L 23/522* (2006.01)

(52) U.S. Cl.
CPC .. *H01L 21/76897* (2013.01); *H01L 21/76831* (2013.01); *H01L 21/76832* (2013.01); *H01L 21/76879* (2013.01); *H01L 23/5226* (2013.01)

(58) Field of Classification Search
CPC ......... H01L 21/76801; H01L 21/76829; H01L 21/76831; H01L 21/768321; H01L 21/76897; H01L 21/8234; H01L 21/823425; H01L 21/823418; H01L 21/823437; H01L 21/823475; H01L 21/823481
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2020/0043796 A1* | 2/2020 | Yeong | H01L 29/785 |

* cited by examiner

*Primary Examiner* — Thanhha S Pham
(74) *Attorney, Agent, or Firm* — NZ CARR LAW OFFICE

(57) ABSTRACT

Embodiments of the present disclosure provide semiconductor devices having conductive features with reduced height and increased width, and methods for forming the semiconductor devices. Particularly, sacrificial self-aligned contact (SAC) layer and sacrificial metal contact etch stop layer (M-CESL) are used to form conductive features with reduced resistance. After formation of the conductive features, the sacrificial SAC and sacrificial M-CESL are removed and replaced with a low-k material to reduce capacitance in the device. As a result, performance of the device is improved.

20 Claims, 41 Drawing Sheets

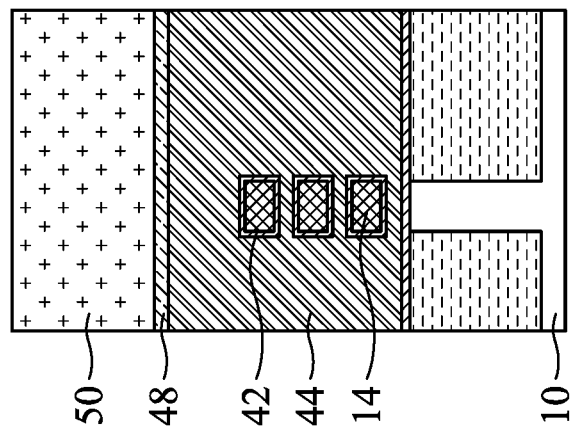
Fig. 12C
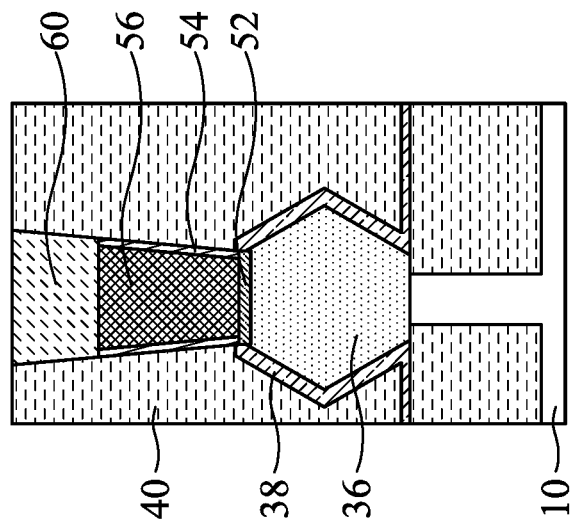
Fig. 12B
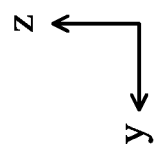

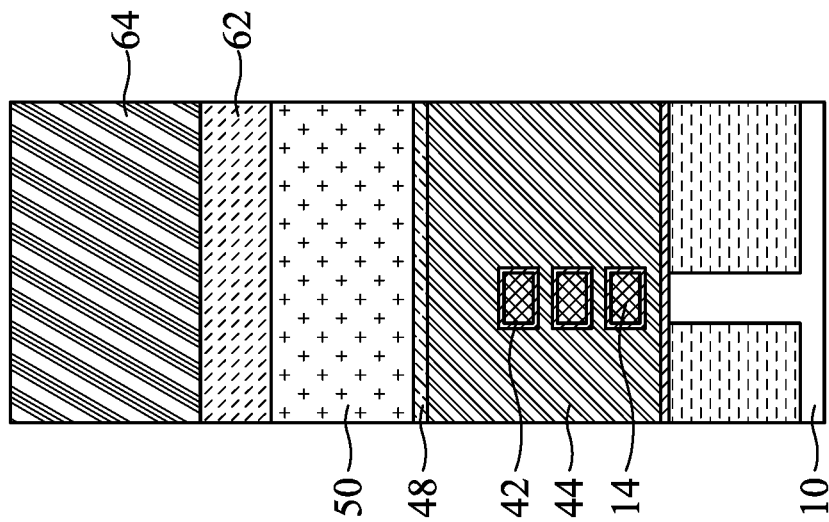
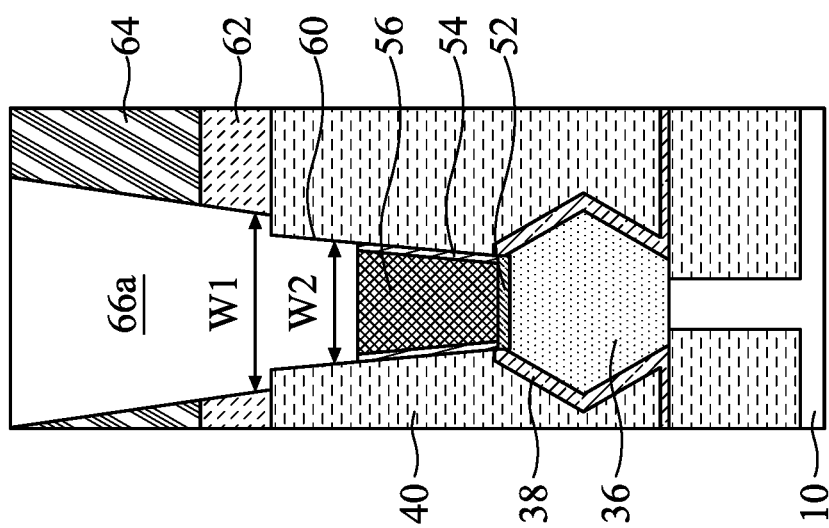
Fig. 14B
Fig. 14C

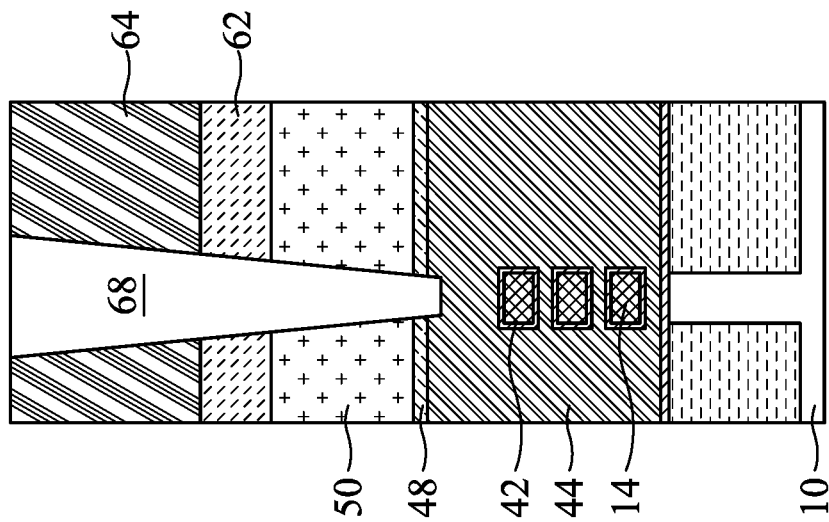
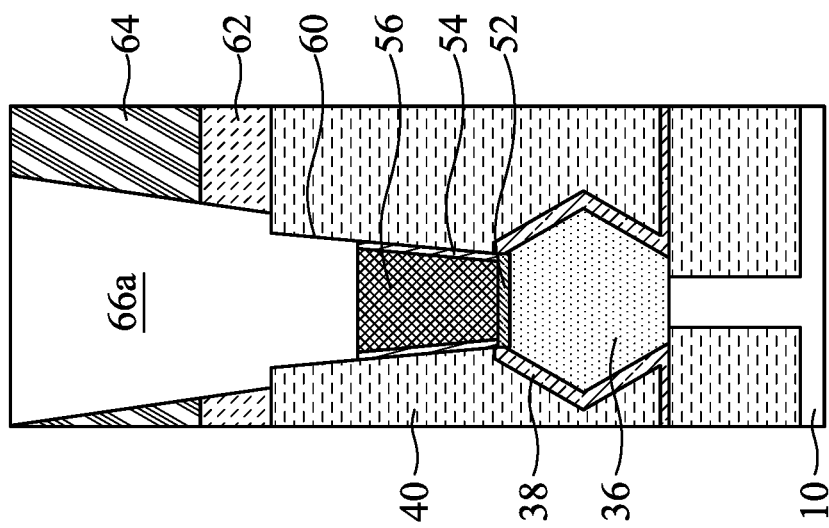
Fig. 15C
Fig. 15B

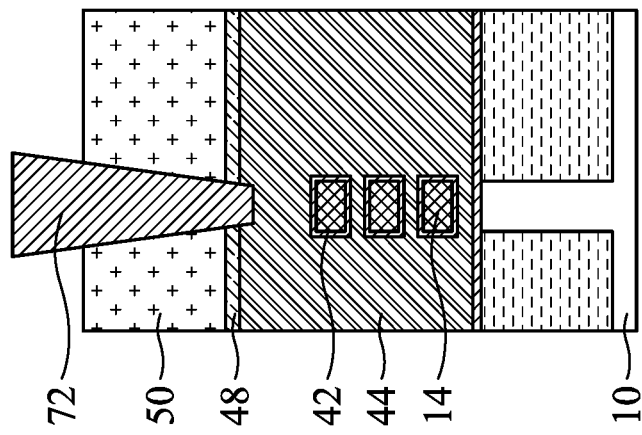
Fig. 18C
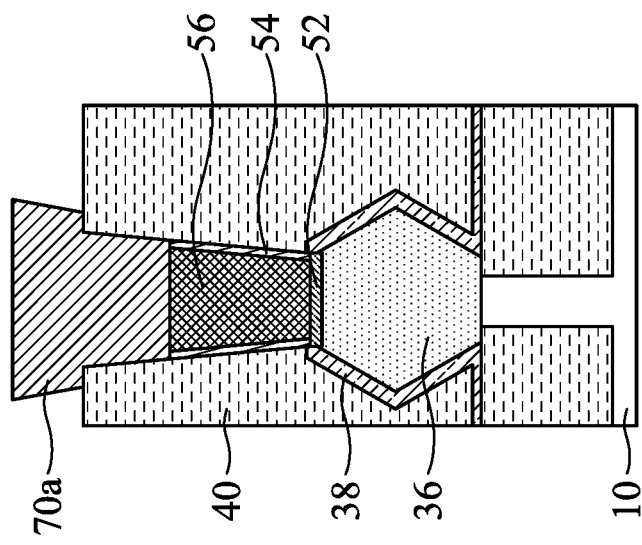
Fig. 18B
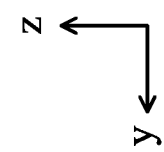

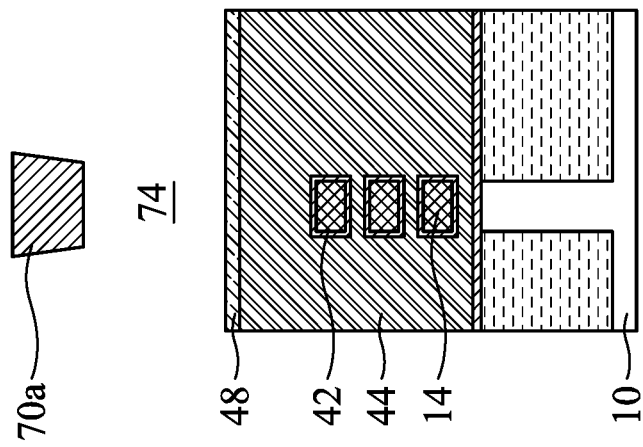
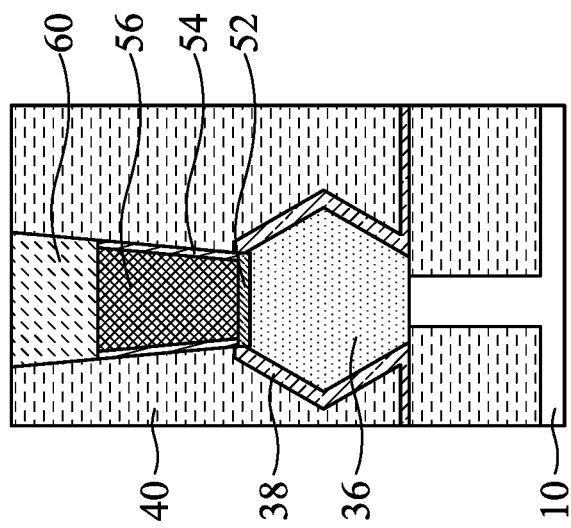
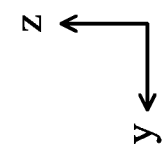

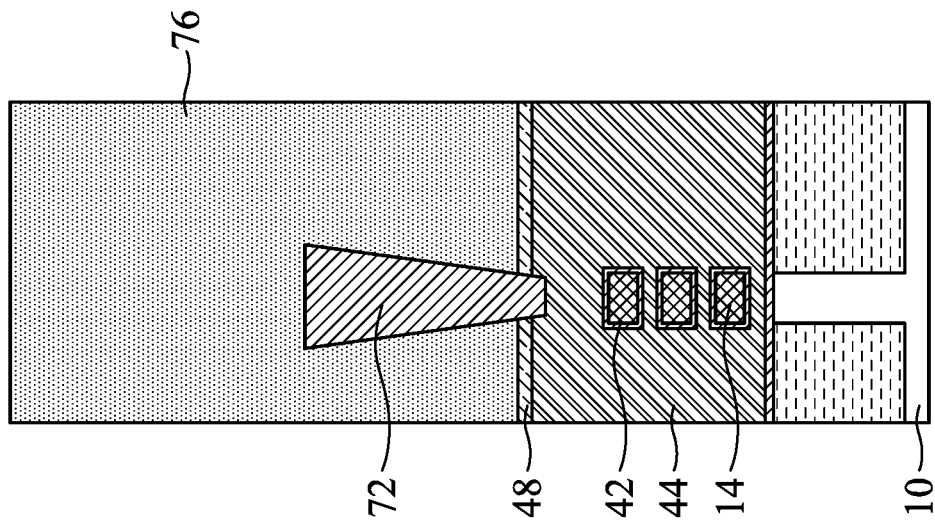
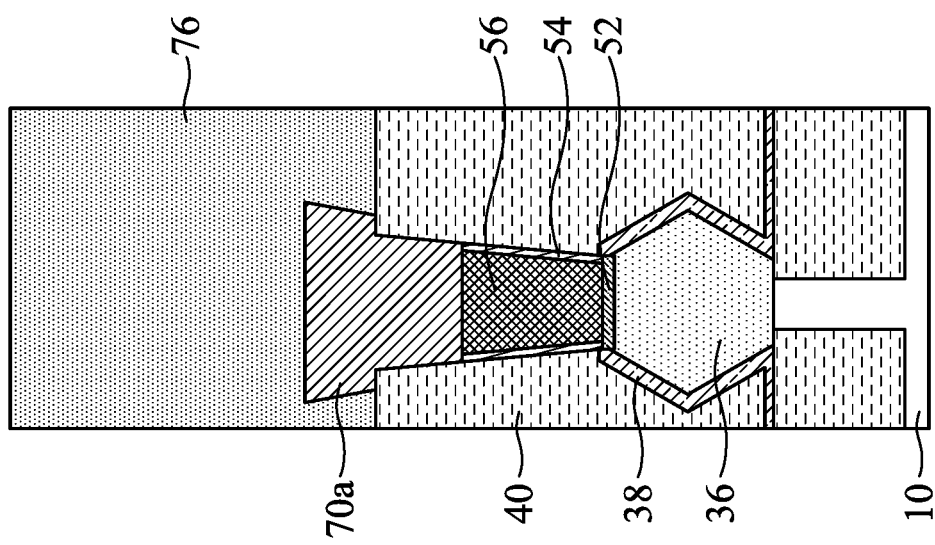
Fig. 20C
Fig. 20B

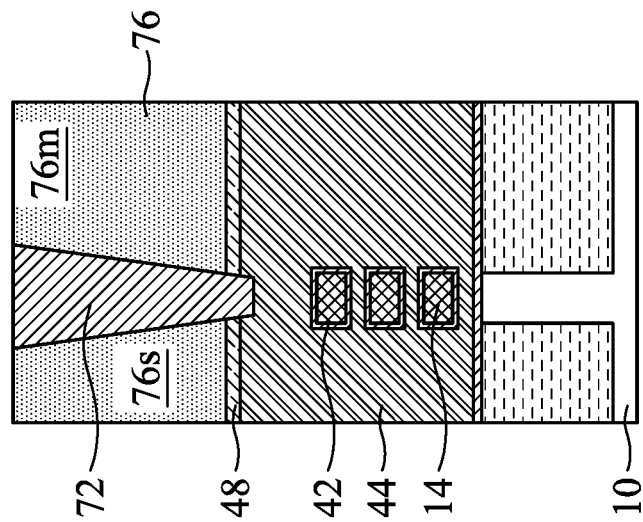
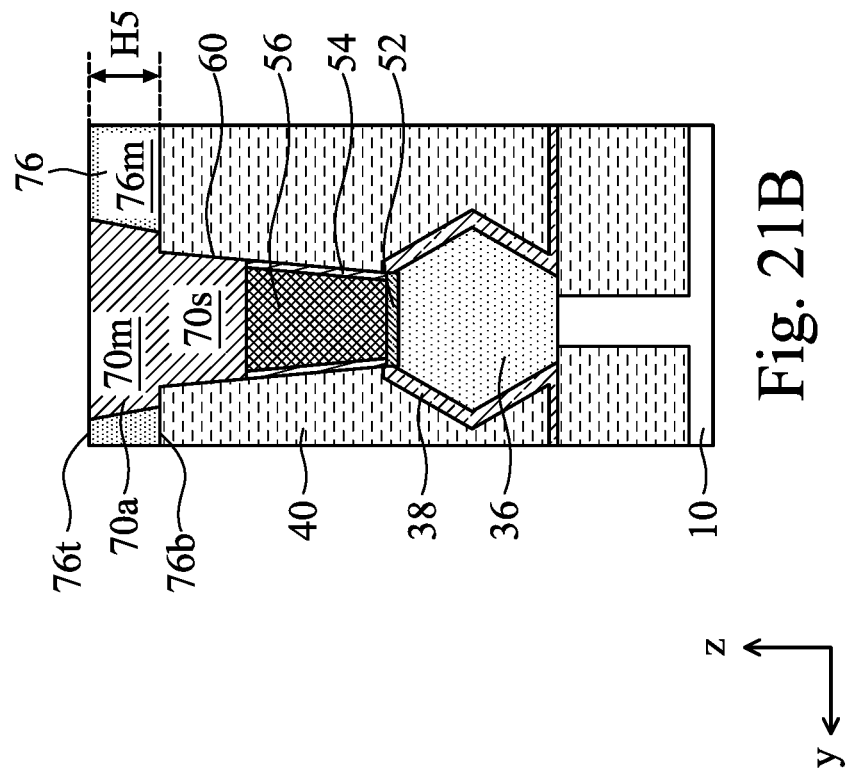
Fig. 21C
Fig. 21B

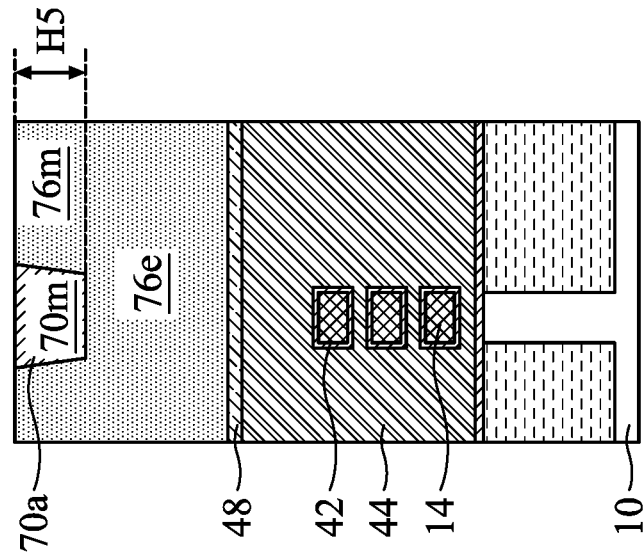
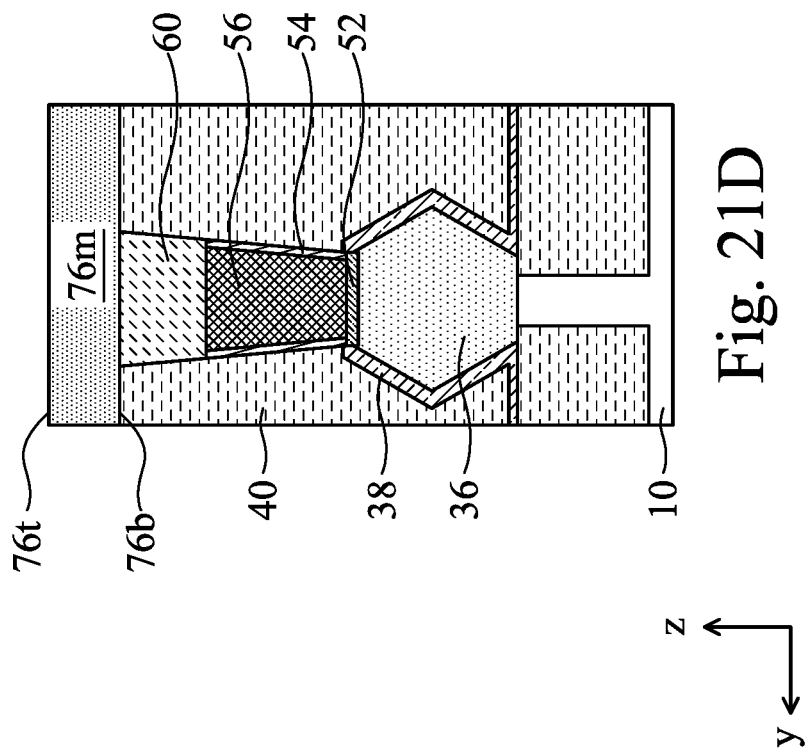
Fig. 21E
Fig. 21D

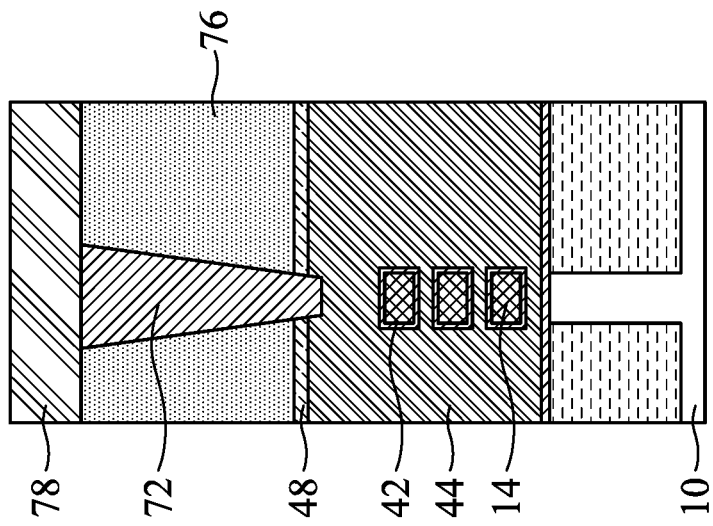
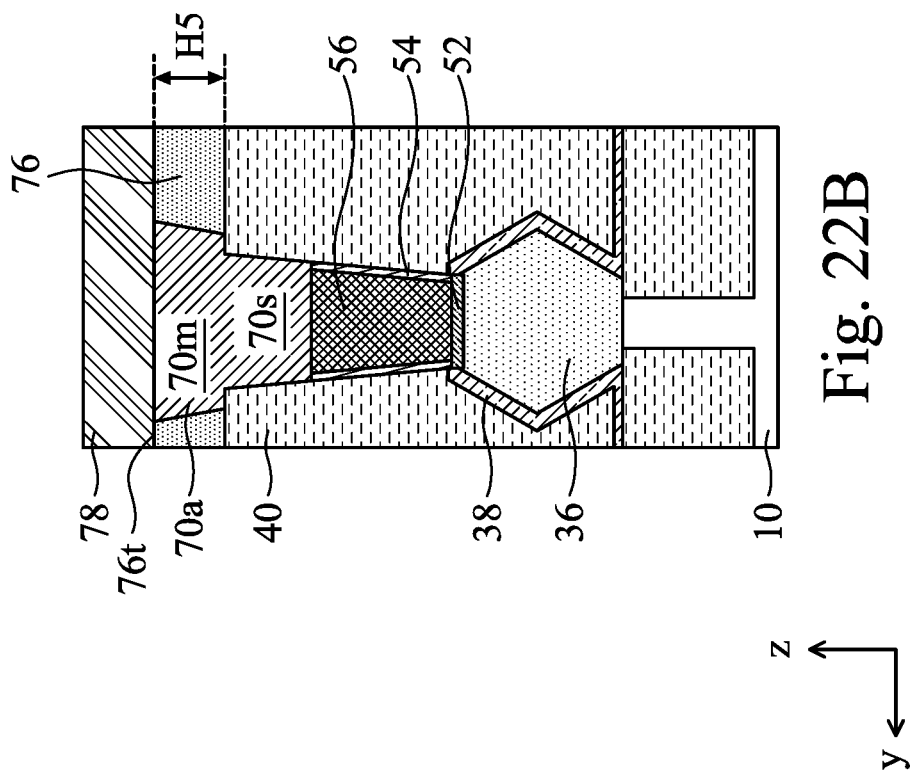
Fig. 22C
Fig. 22B

SEMICONDUCTOR DEVICES INCLUDING LOW-K METAL GATE ISOLATION AND METHODS OF FABRICATION THEREOF

BACKGROUND

An integrated circuit (IC) typically includes a plurality of semiconductor devices, such as field-effect transistors and metal interconnection layers formed on a semiconductor substrate. The interconnection layers, designed to connect the semiconductor devices to power supplies, input/output signals, and to each other, may include signal lines and power rails. The semiconductor industry has experienced continuous rapid growth due to constant improvements in the performance of various electronic components, including the metal contacts and interconnection layers. For the most part, it is desirable to have lower capacitance and lower resistance in interconnection layers. However, interconnection features may have higher than desirable capacitance and/or resistance as a result of current technology used for forming the interconnection features. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 11, 12A-C to 18A-C, and 19A-E and 22A-E schematically illustrate various stages of manufacturing a semiconductor device according to some embodiments of the present disclosure.

DETAILED DESCRIPTION

Figure 1:
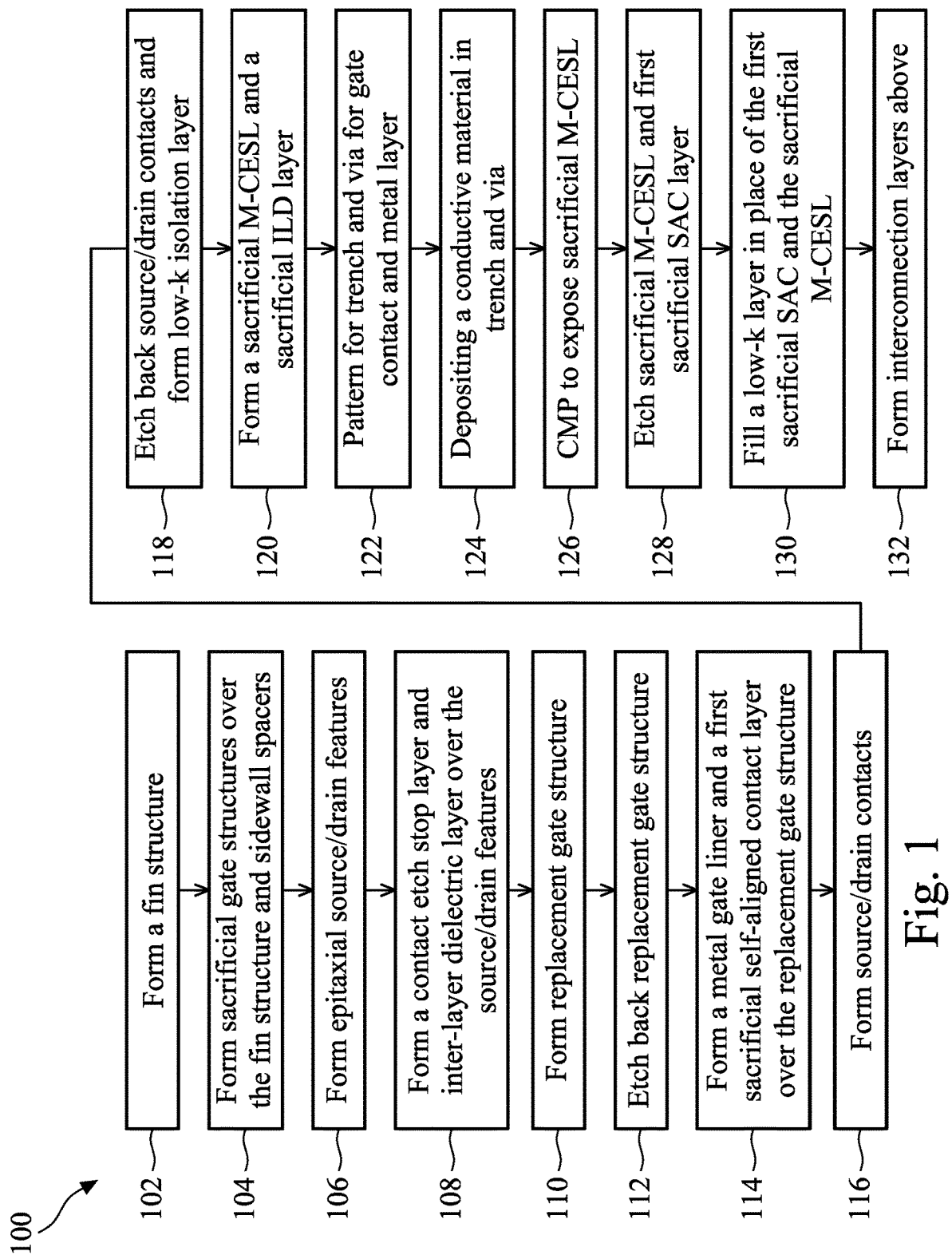
FIG. 1 is a flow chart of a method for manufacturing of a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

In current technologies, metal conductive features, such as lines and vias in connection with source/drain metal contacts, can be either extend through a high-k metal contact etch stop layer (M-CESL) and a low-k interlayer dielectric (ILD) layer or extend through a low-k M-CESL but with reduced width. Extending through a high-k M-CESL and a low-k interlayer dielectric (ILD) layer results in a metal conductive feature with a higher resistance, higher capacitance, and larger dimension of the final device. Extending through a low-k M-CESL but with reduced width also results in a conductive feature with increased resistance. Embodiments of the present disclosure provide semiconductor devices having metal conductive features with reduced thickness and increased width, and methods for forming the semiconductor devices. Particularly, sacrificial self-aligned contact (SAC) layer and sacrificial metal contact etch stop layer (M-CESL) are used to form conductive features with reduced resistance. After formation of the conductive features, the sacrificial SAC and sacrificial M-CESL are removed and replaced with a low-k material to reduce capacitance in the device. As a result, performance of the device is improved. Various embodiments are discussed in more detail below.

While the embodiments of this disclosure are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure.

FIG. 1 is a flow chart of a method 100 for manufacturing of a semiconductor device according to embodiments of the present disclosure. FIGS. 2 to 22 schematically illustrate various stages of manufacturing a semiconductor device according to the method 100. Additional operations can be provided before, during, and after operations/processes in the method 100, and some of the operations described below can be replaced or eliminated, for additional embodiments of the method. The order of the operations/processes may be interchangeable.

Figure 2:
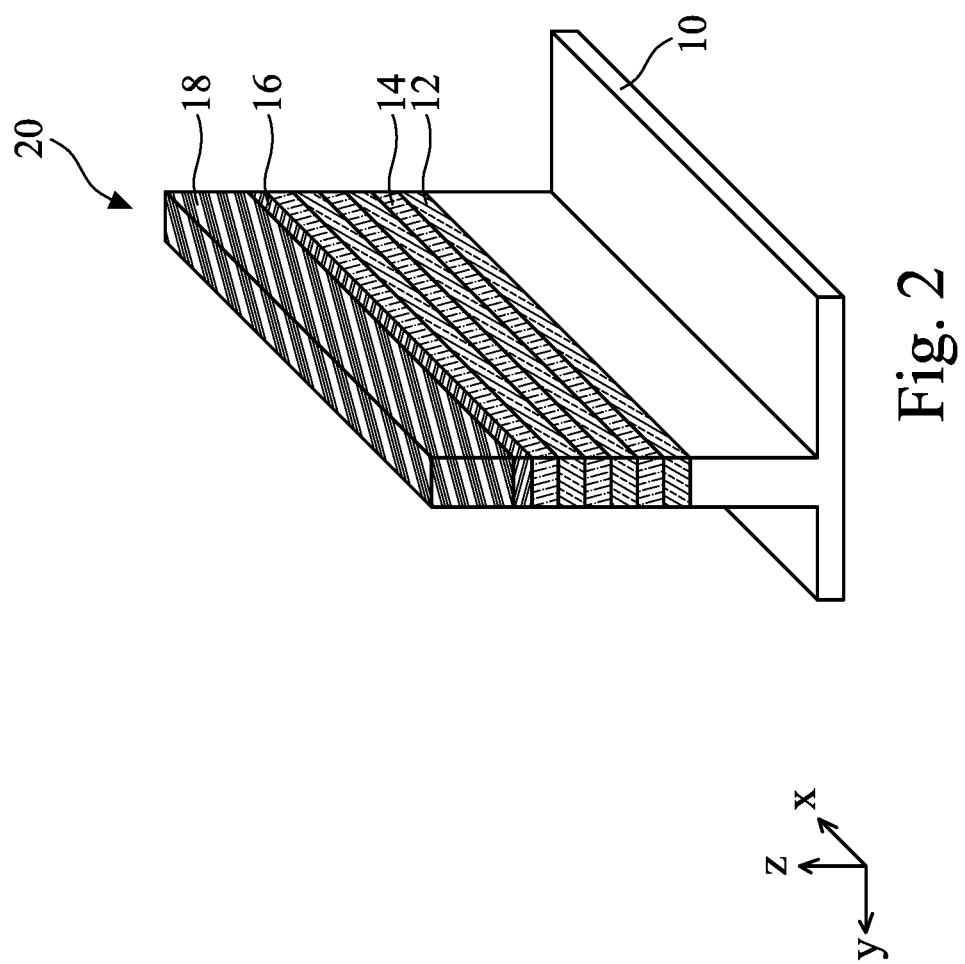

The method 100 begins at operation 102, a fin structure 20 is formed over a semiconductor substrate 10, as shown in FIG. 2. The substrate 10 is provided to form a semiconductor device thereon. The substrate 10 may include a single crystalline semiconductor material such as, but not limited to Si, Ge, SiGe, GaAs, InSb, GaP, GaSb, InAlAs, InGaAs, GaSbP, GaAsSb, and InP. The substrate 10 may include various doping configurations depending on circuit design. For example, different doping profiles, e.g., n-wells, p-wells, may be formed in the substrate 10 in regions designed for different device types, such as nFET and pFET. In some embodiments, the substrate 10 may be a silicon-on-insulator (SOI) substrate including an insulator structure (not shown) for enhancement.

To form the fin structure 20, one or more pairs of first semiconductor layer 12 and second semiconductor layer 14 are formed over the substrate 10. The semiconductor layers 12, 14 may be formed by a molecular beam epitaxy (MBE) process, a metalorganic chemical vapor deposition (MOCVD) process, and/or other suitable epitaxial growth processes. In some embodiments, the semiconductor layers 14 include the same material as the substrate 10. In some embodiments, the semiconductor layers 12 and 14 include different materials than the substrate 10. In some embodiments, the semiconductor layers 12 and 14 are made of materials having different lattice constants. The first semiconductor layers 12 in channel regions may eventually be removed and serve to define a vertical distance between adjacent channel regions for a subsequently formed multi-gate device. In some embodiments, the first semiconductor layers 12 include an epitaxially grown silicon germanium (SiGe) layer and the second semiconductor layers 14 include an epitaxially grown silicon (Si) layer. Alternatively, in some embodiments, either of the semiconductor layers 12 and 14 may include other materials such as Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

The fin structure 20 is formed by patterning a pad layer 16 and a hard mask 18 formed on the pairs of semiconductor layers 12, 14, and then etching through the pairs of semiconductor layers 12, 14 and a portion of the substrate 10.

Figure 3:
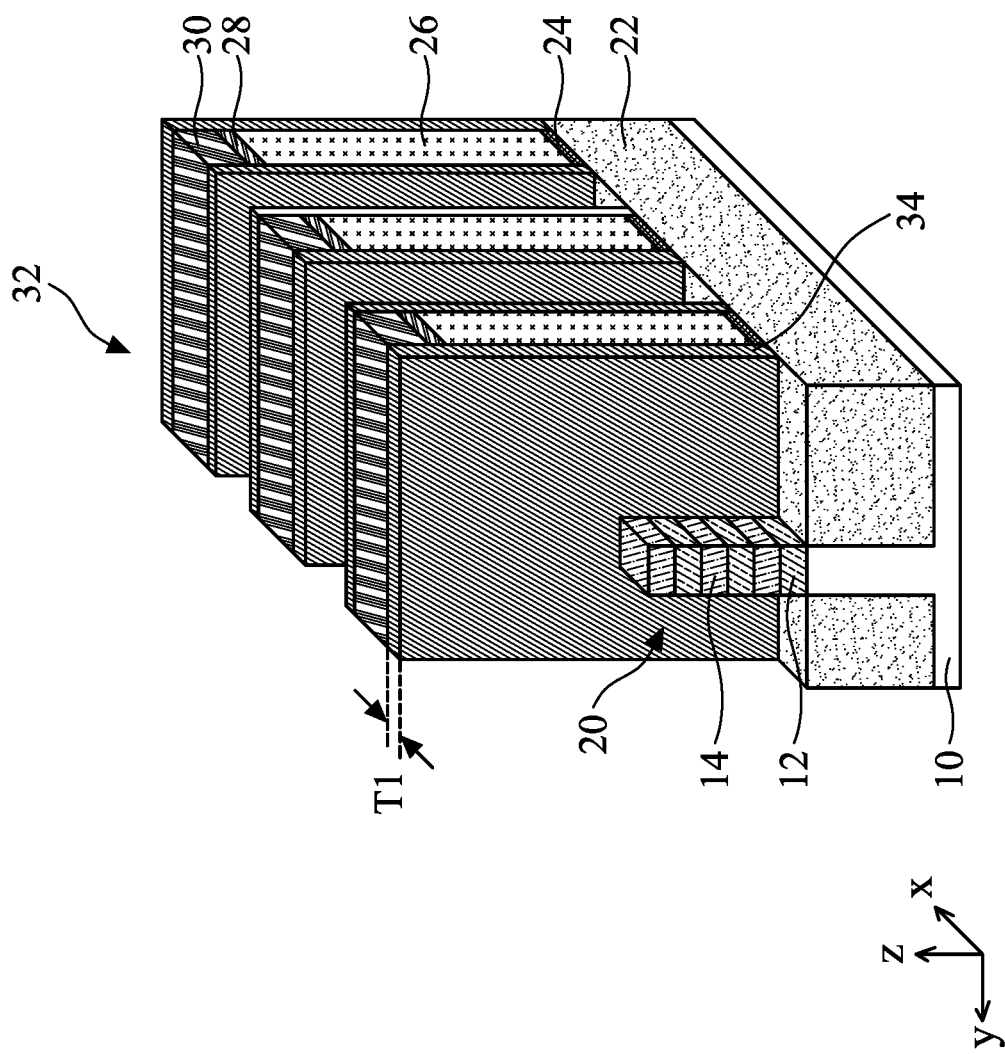

In operation 104, sacrificial gate structures 32 are formed over the fin structure 20, and sidewall spacers 34 are formed on sides of the sacrificial gate structure 32, as shown in FIG. 3.

Figure 4:
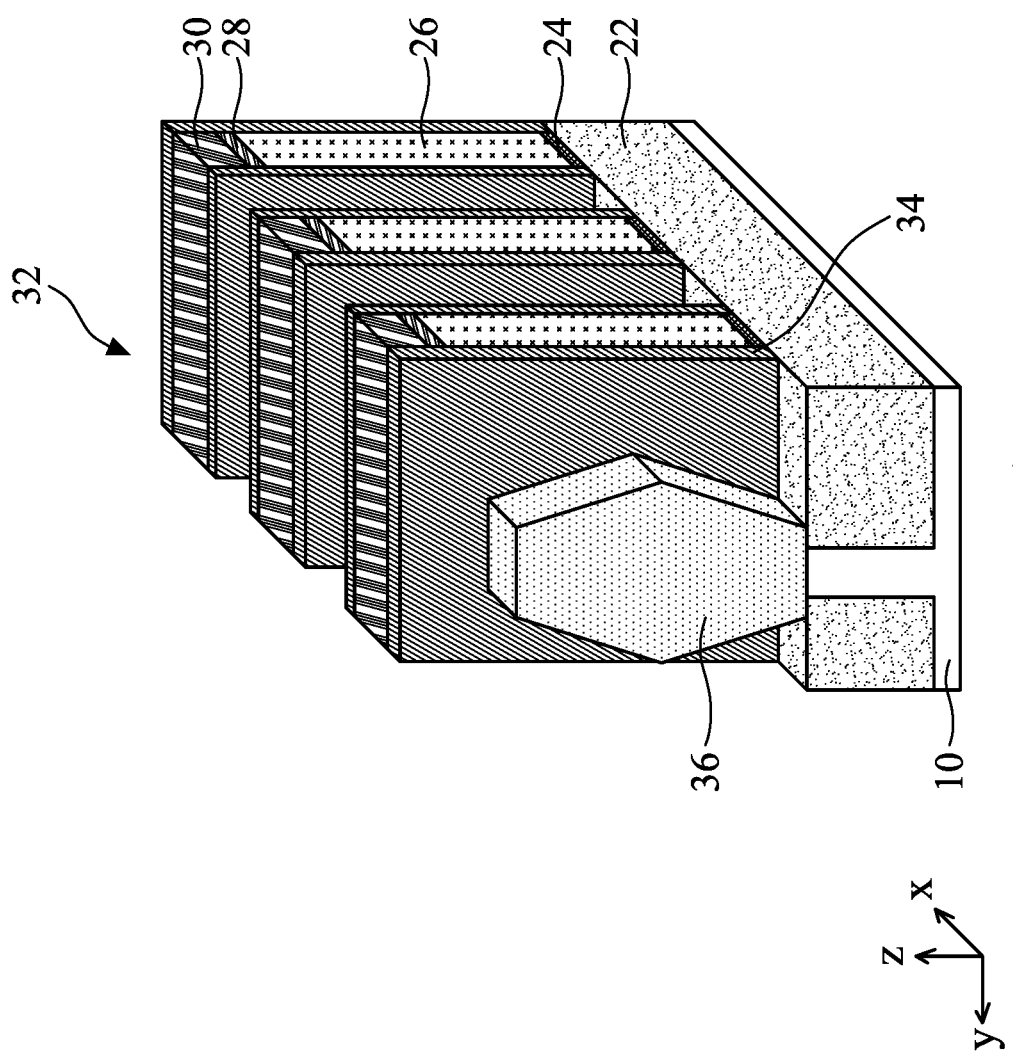

After formation of the fin structure 20, an isolation layer 22 is formed in trenches between the fin structures 20, as shown in FIG. 4. The isolation layer 22 is formed over the substrate 10 and then etched back to expose the pairs of semiconductor layers 12, 14. In some embodiments, the isolation layer 22 may include silicon oxide, silicon nitride, silicon oxynitride, fluorine-doped silicate glass (FSG), a low-k dielectric, combinations thereof.

The sacrificial gate structures 32 may include a sacrificial gate dielectric layer 24, a sacrificial gate electrode layer 26, a pad layer 28, and a mask layer 30. The sacrificial gate dielectric layer 24 may include one or more layers of dielectric material, such as $SiO_2$, SiN, a high-k dielectric material, and/or other suitable dielectric material. The sacrificial gate electrode layer 26 may include silicon such as polycrystalline silicon or amorphous silicon. The pad layer 28 may include silicon nitride. The mask layer 30 may include silicon oxide. Next, a patterning operation is performed on the mask layer 30, the pad layer 28, the sacrificial gate electrode layer 26 and the sacrificial gate dielectric layer 24 to form the sacrificial gate structure 32.

The sidewall spacers 34 are formed on sidewalls of each sacrificial gate structure 32. The sidewall spacers 34 may be formed from a dielectric material, such as SiO, SiN, SiC, SiCN, SiOC, SiON, SiOCN, or a combination thereof. In some embodiments, the insulating material of the sidewall spacers 34 is a silicon nitride-based material, such as SiN, SiON, SiOCN or SiCN and combinations thereof. In some embodiments, a thickness T1 of the sidewall spacer 34 is in a range between about 0.5 nm and about 10 nm.

In operation 106, source/drain features 36 are formed on opposing sides of the sacrificial gate structures 32, as shown in FIG. 4. The operation 106 may include etching back portions of the fin structure 20 exposed outside the sacrificial gate structures 32, etching back the first semiconductor layers 12 from under the sidewall spacers 34 to form inner spacer cavities, forming inner spacers 35 (shown in FIG. 6) in the inner spacer cavities, and epitaxially growing the source/drain features 36 from the exposed surface of the substrate 10 and the second semiconductor layers 14.

The inner spacers 35 may be formed from a dielectric material, such as SiO, SiN, SiC, SiCN, SiOC, SiON, SiOCN, or a combination thereof. In some embodiments, the inner spacers 35 may include one of silicon nitride (SiN) and silicon oxide ($SiO_2$), SiONC, or a combination thereof.

The source/drain features 36 may include one or more semiconductor materials depending on the device type. The source/drain features 36 may be epitaxially grown material with a thickness in a range between about 0.5 nm to about 30 nm.

For n-type devices, the source/drain features 36 may include one or more layers of Si, SiP, SiC, SiCP, or a group III-V material (InP, GaAs, AlAs, InAs, InAlAs, InGaAs). In some embodiments, the source/drain features 36 may be doped with n-type dopants, such as phosphorus (P), arsenic (As), etc, for n-type devices.

For p-type devices, the source/drain features 36 may include one or more layers of Si, SiGe, SiGeB, Ge, or a group III-V material (InSb, GaSb, InGaSb). In some embodiments, the source/drain features 36 may be doped with p-type dopants, such as boron (B).

Figure 5:
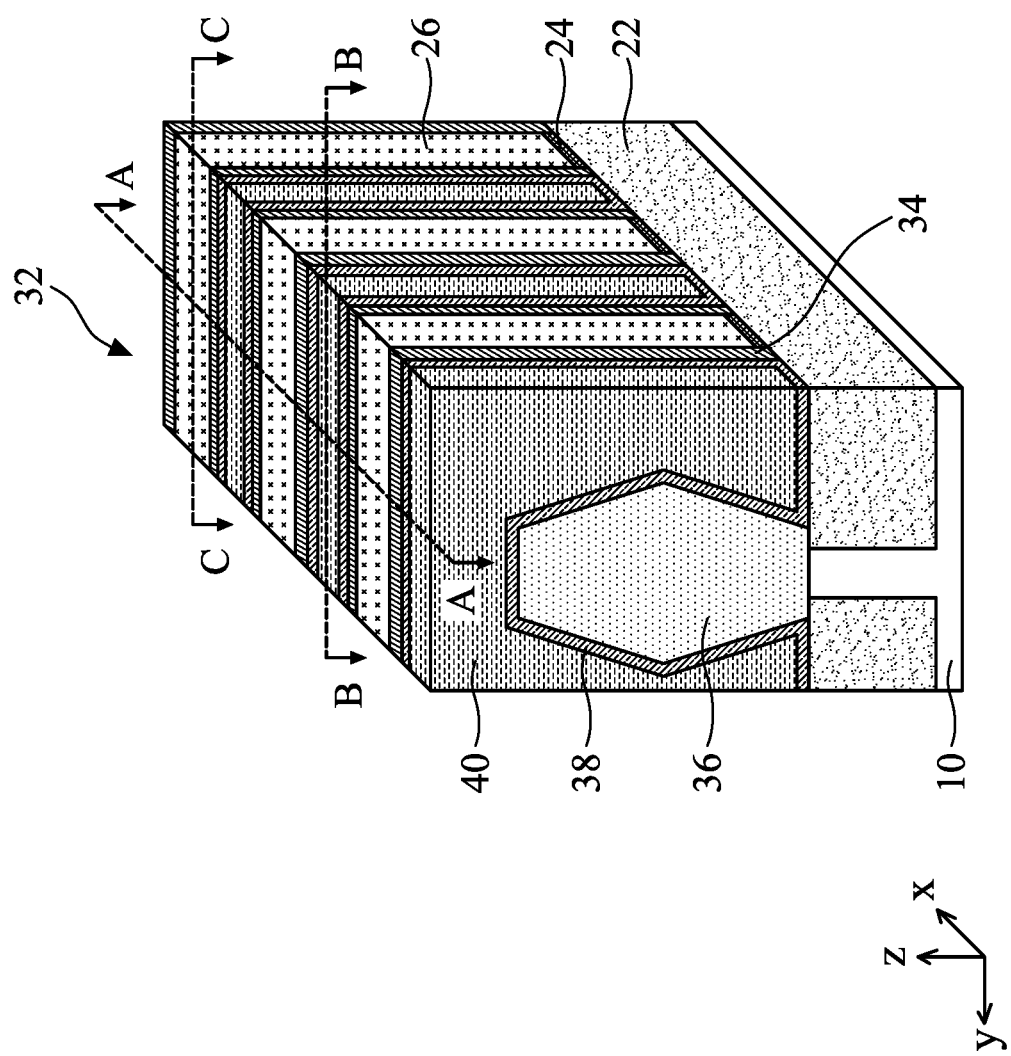

In operation 108, a contact etch stop layer (CESL) 38 and an interlayer dielectric (ILD) layer 40 are formed over the exposed surfaces as shown in FIG. 5. In the example, the CESL 38 is formed on the source/drain features 36, the sidewall spacers 34, and the isolation layer 22. The CESL 38 may include $Si_3N_4$, SiON, SiCN or any other suitable material, and may be formed by CVD, PVD, or ALD. In some embodiments, the CESL 38 may be formed from a material different from the sidewall spacers 34 so that the sidewall spacers 34 can be selectively etched back in the subsequent process to form SAC layers.

The interlayer dielectric (ILD) layer 40 is formed over the contract etch stop layer (CESL) 38. The materials for the ILD layer 40 include compounds comprising Si, O, C, and/or H, such as silicon oxide, SiCOH and SiOC. Organic materials, such as polymers, may be used for the ILD layer 40. The ILD layer 40 protects the source/drain features 36 during the removal of the sacrificial gate structures 32. A planarization operation, such as CMP, is performed to expose the sacrificial gate electrode layer 26 for subsequent removal of the sacrificial gate structures 32.

FIGS. 6-11, and 12A-22A are cross sectional views of the device along A-A line of FIG. 5 at various stages of fabrication according to the method 100. FIGS. 12B-22B are cross sectional views of the device along B-B line of FIG. 5. FIGS. 12C-22C are cross sectional views of the device along C-C line of FIG. 5.

Figure 6:
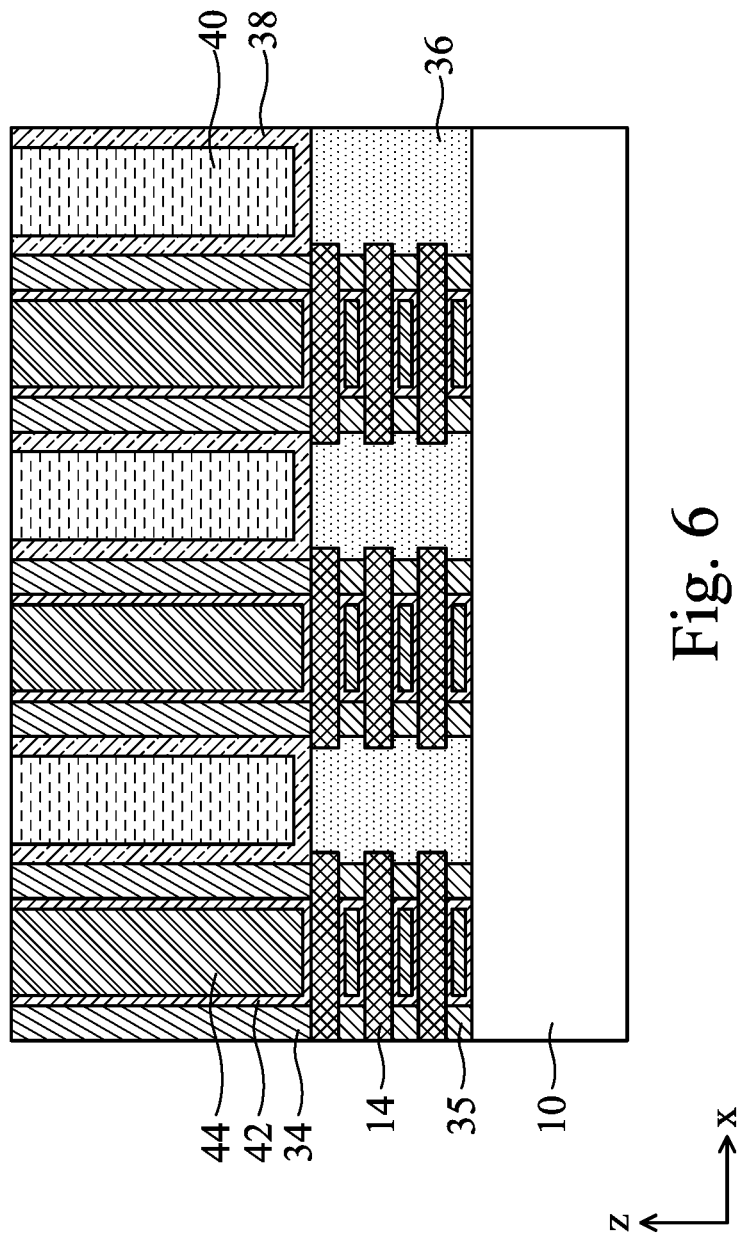

In operation 110, a replacement gate sequence is performed to form a gate dielectric layer 42 and the gate electrode layer 44 as shown in FIG. 6. The replacement gate sequence may include removing the sacrificial gate electrode layer 26 and the sacrificial gate dielectric layer 24 to expose the fin structure 20 under the sacrificial gate structure 32. The first semiconductor layers 12 are subsequently removed resulting forming nanosheets of the second semiconductor layers 14.

The gate dielectric layer 42 is then deposited on exposed surfaces of each nanosheet of the second semiconductor layers 14, exposed surfaces of the inner spacers 35, and exposed surfaces of the sidewall spacers 34. The gate dielectric layer 42 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 42 has a dielectric constant about 7.

The gate electrode layer 44 is then formed over the gate dielectric layer 42. The gate electrode layer 44 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. After the formation of the gate electrode layer 42, a planarization process, such as a CMP process, is performed to remove excess deposition of the gate electrode material and expose the top surface of the ILD layer 40.

As shown in FIG. 6, the one or more second semiconductor layers 14 connect the source/drain features 36 on opposing sides of the one or more second semiconductor layers 14 forming a multichannel transistor. The one or more semiconductor layers 14 function as a channel region between the source/drain features 36 of the multi-channel transistor. The connection between the source/drain features 36 may be controlled by the voltage applied to the gate electrode layer 44. Alternatively, the channel region may be a single channel transistor with a single channel fin-shape channel region or a planar channel region.

Figure 7:
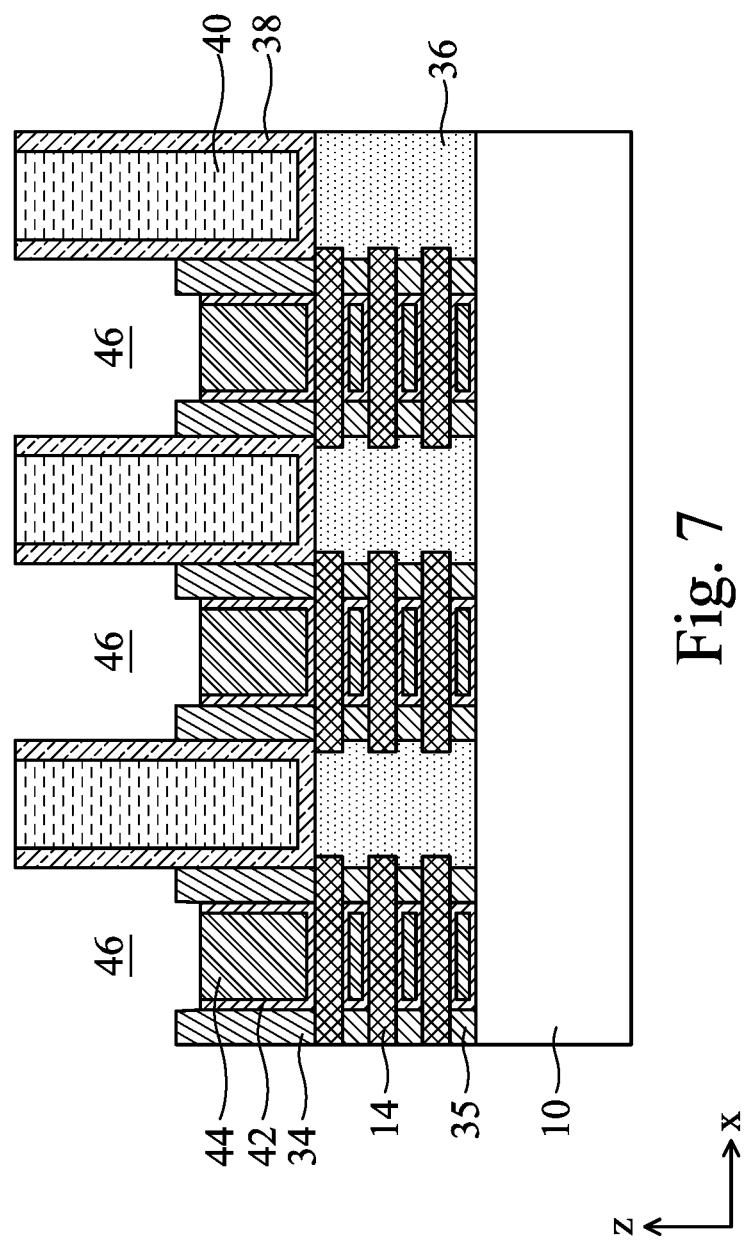

In operation 112, a metal gate etching back (MGEB) process is performed to remove portions of the gate dielectric layer 42 and the gate electrode layer 44, as shown in FIG. 7. Trenches 46 are formed in the region above the remaining gate electrode layer 44. The MGEB process may be a plasma etching process employing one or more etchants such as chlorine-containing gas, a bromine-containing gas, and/or a fluorine-containing gas. The etching process allows the gate dielectric layer 42 and the gate electrode layer 44 to be selectively etched from the ILD layer 40 and the CESL 38.

In some embodiments, the sidewall spacers 34 are also etched back to a level lower than the CESL 38 and higher than the gate electrode layer 44. By etching the sidewall spacers 34 below the CESL 38, the sidewall spacers 34 can be covered and protected by the subsequently formed SAC layer while forming source/drain metal contacts. By keeping the sidewall spacers 34 at a level higher than the gate electrode layer 44 and gate dielectric layer 42, the gate electrode layer 44 remain protected by the sidewall spacers 34. The sidewall spacers 34 may be etched back during the MGEB process or in a separate etching process.

Figure 8:
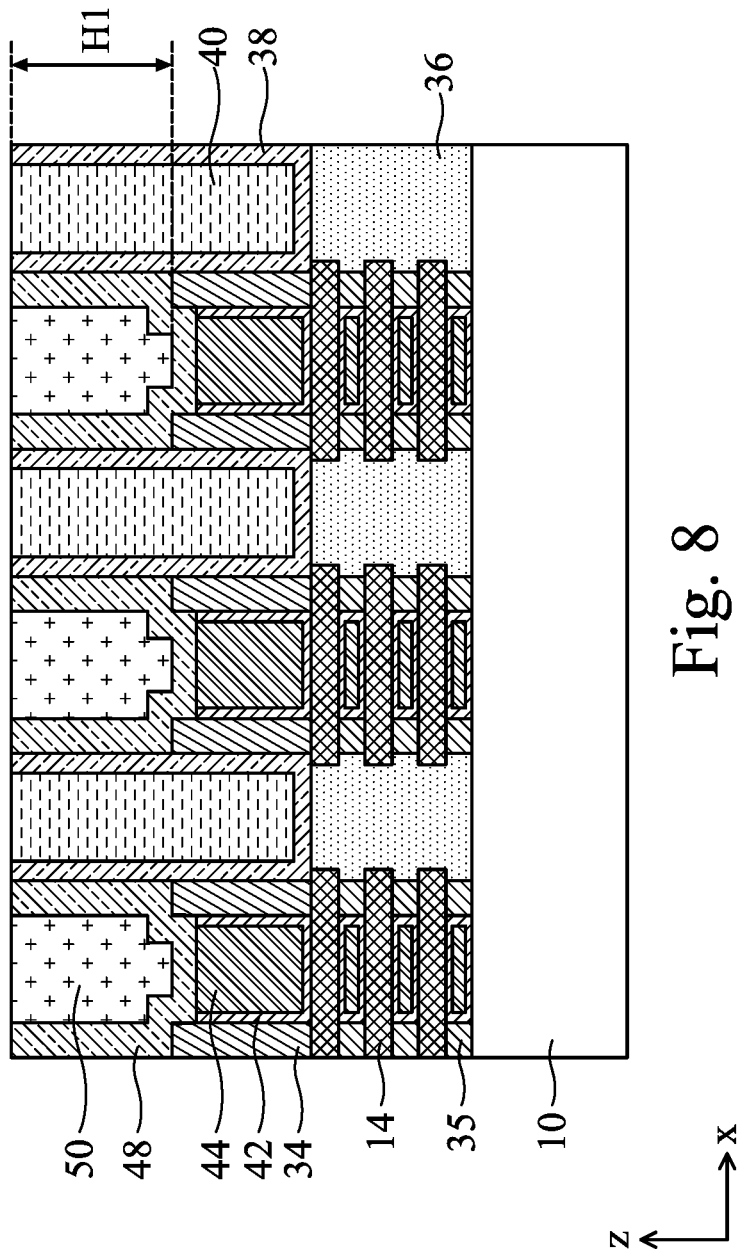

In operation 114, a sacrificial self-aligned contact (SAC) layer 50 is filled in the trenches 46 above the gate electrode layer 44, as shown in FIG. 8. In some embodiments, a metal gate liner 48 may be first deposited on exposed surfaces in the trenches 46 prior to filling the trenches 46 with the sacrificial SAC layer 50. The metal gate liner 48 and the sacrificial SAC layer 50 may be formed by a suitable deposition process, such as CVD, PVD, or ALD. After filling the trenches 46 with the sacrificial SAC layer 50, a planarization process, such as a CMP process, is performed to remove excess deposition of the sacrificial SAC layer 50 and metal gate liner 48 to expose the top surface of the ILD layer 40.

The metal gate liner 48 may function as a diffusion barrier for the gate electrode layer 44. The metal gate liner 48 may be a dielectric layer including but not limited to SiO, SiN, SiC, SiCN, SiOC, SiON, SiOCN, ZrO, ZrN, or a combination thereof. The metal gate liner 48 may have a thickness in a range between about 0.5 nm and 10 nm. A metal gate liner 48 thinner than 0.5 nm may not be able to function as a barrier. A metal gate liner 48 thicker than 10 nm may increase dimension of the device without additional benefit.

The sacrificial SAC layer 50 may be any dielectric layer that can be used as an etch stop layer during subsequent trench and via patterning for metal contacts. In some embodiments, the sacrificial SAC layer 50 may be a high-k dielectric layer. The sacrificial SAC layer 50 may be a dielectric layer including but not limited to SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or any combinations thereof. In some embodiments, the sacrificial SAC layer 50 may have a height H1 in a range between about 0.5 nm and about 30 nm. A sacrificial SAC layer 50 thinner than 0.5 nm may not be able to function as an etch stop layer in the subsequent process. A sacrificial SAC layer 50 thicker than 30 nm may increase dimension of the device without additional benefit.

Figure 9:
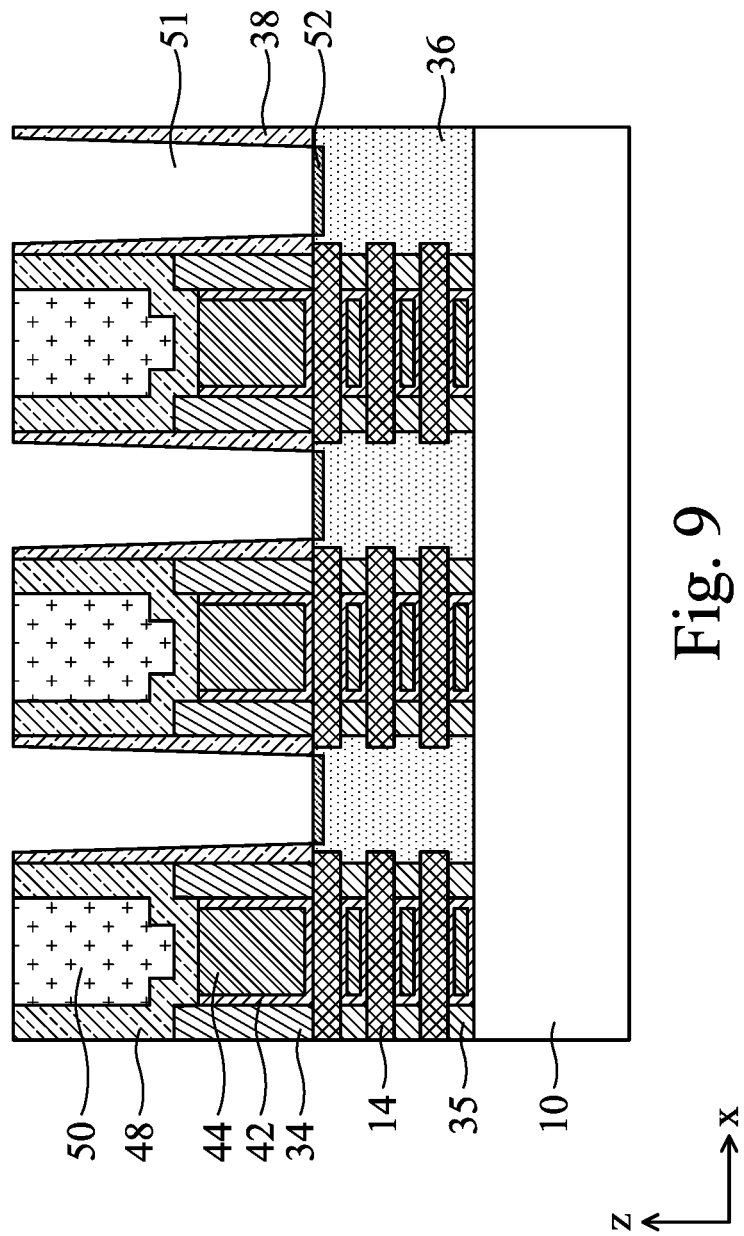
Figure 10:
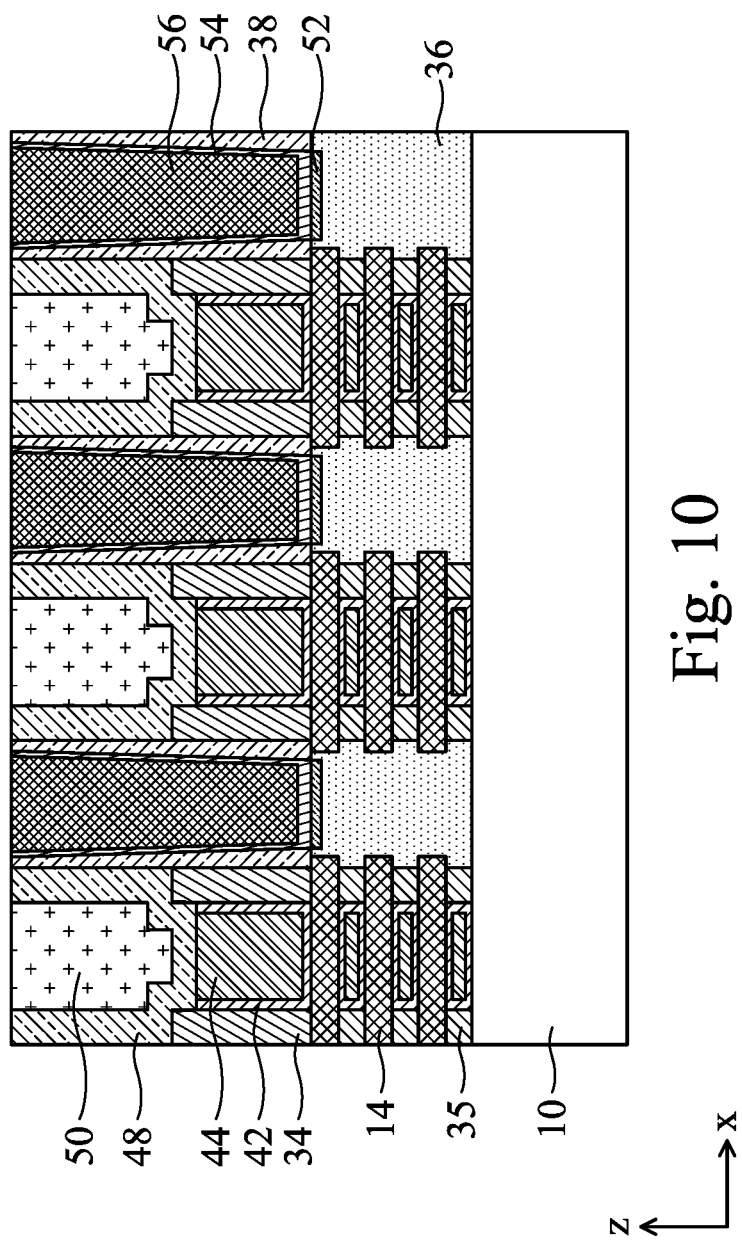
Figure 11:
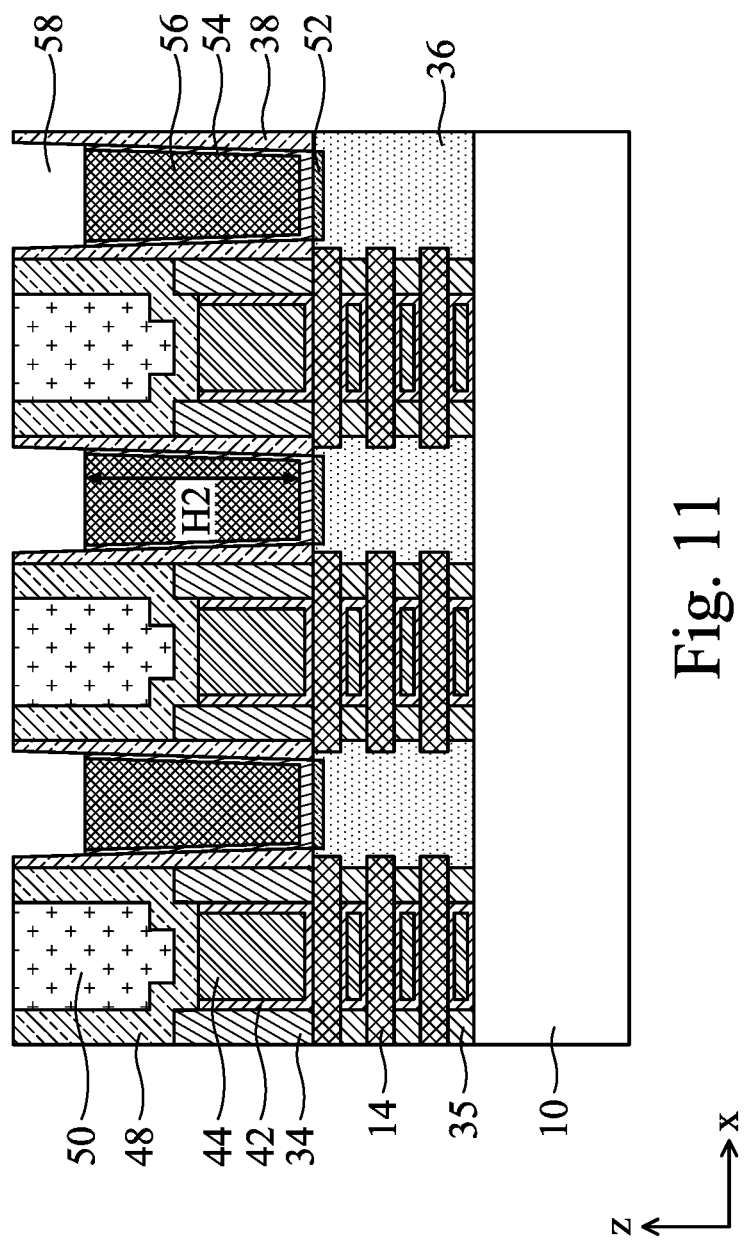
Figure 12A:
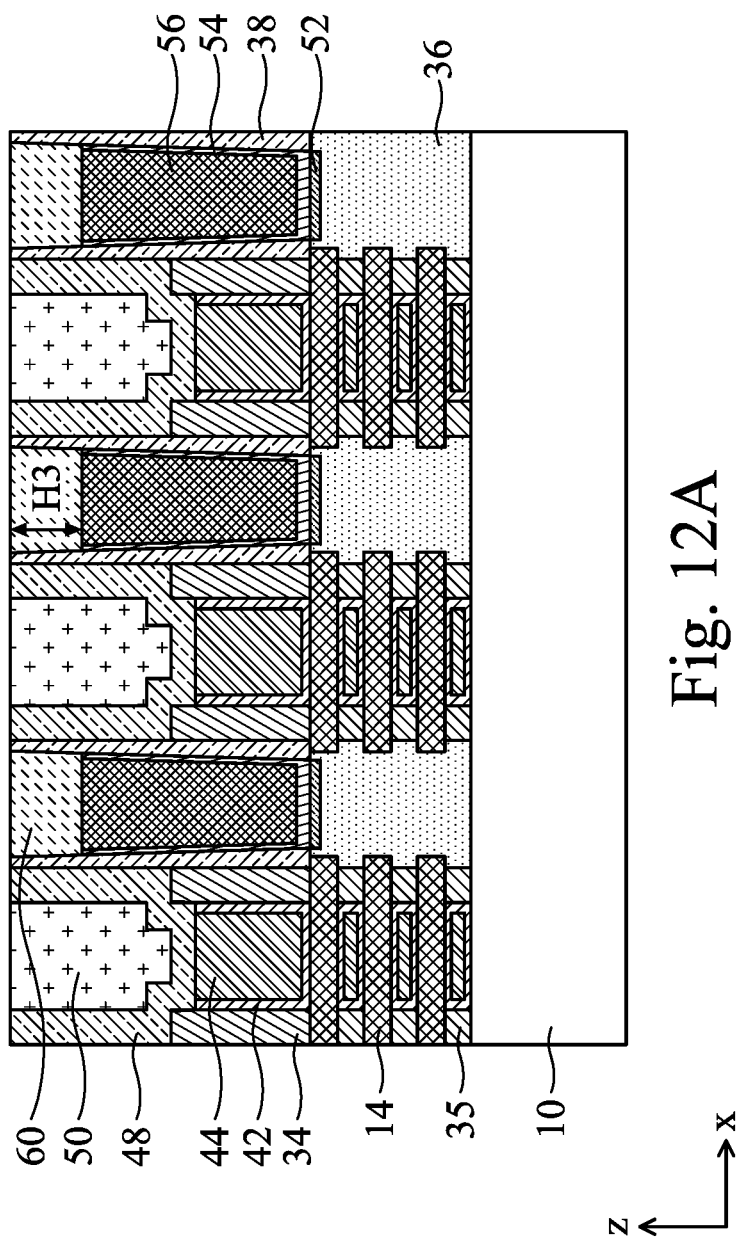

In operation 116, source/drain metal contacts 56 are formed as shown in FIGS. 9 and 10. Contact holes 51 may be formed through the ILD layer 40 and the CESL 38 and subsequently filled with a conductive material to form the source/drain metal contacts 56. Suitable photolithographic and etching techniques are used to form the contact holes 51 through various layers to expose a top surface of the source/drain features 36. In some embodiments, the contact holes 51 may be formed over all source/drain features 36 to form source/drain metal contacts 56 thereon to achieve structure balance. In other embodiments, the contact holes 51 are formed over selected source/drain features 36 to be connected to power supply or signal lines from the top side.

After the formation of the contact holes 51, a silicide layer 52 is selectively formed over a top surface of the source/drain features 36 exposed by the contact holes 51, as shown in FIG. 9. The silicide layer 52 conductively couples the source/drain features 36 to the subsequently formed interconnect structures. The silicide layer 52 may be formed by depositing a metal source layer to cover exposed surfaces including the exposed surfaces of the epitaxial source/drain features 36 and performing a rapid thermal annealing process. In some embodiments, the metal source layer includes a metal layer selected from but not limited Ti, Co, Ni, NiCo, Pt, Ni(Pt), Ir, Pt(Ir), Er, Yb, Pd, Rh, Nb, or TiSiN. After the formation of the metal source layer, a rapid thermal anneal process is performed, for example, a rapid anneal at a temperature between about 700° C. and about 900° C. During the rapid anneal process, the portion of the metal source layer over the source/drain features 36 reacts with silicon in the source/drain features 36 to form the silicide layer 52. Unreacted portion of the metal source layer is then removed. In some embodiments, the silicide layer 36 has a thickness in a range between about 0.5 nm and 10 nm.

After formation of the silicide layer 52, a conductive material is deposited to fill contact holes 51 and form the source/drain metal contacts 56. In some embodiments, a barrier layer 54 is formed over surfaces of the contact holes 51 prior to filling the source/drain metal contacts 56. In some embodiments, the barrier layer 54 may be formed from Ti, Ta, TiN, TaN, W, Co, Ru, or the like. The barrier layer 54 may have a thickness less than about 10 nm. The source/drain metal contacts 56 may be formed from a conductive material. In some embodiments, the conductive material for the side source/drain metal contacts 56 includes but limited to W, Co, Ru, Ti, Ni, Cu, Au, Ag, Pt, Pd, Ir, Os, Rh, Al, Mo, or the like.

In some embodiments, the source/drain metal contacts 56 may be formed by a suitable deposition process, such as CVD, PVD, plating, ALD, or other suitable technique. Subsequently, a CMP process is performed to remove a portion of the conductive material layer above a top surface of the sacrificial SAC layer 50.

In operation 118, the source/drain metal contacts 56 are etched back to form isolation holes 58 and isolation features 60 are formed in the isolation holes 58, as shown in FIGS. 11 and FIGS. 12A-C. The isolation holes 58 may be formed by a plasma etching process employing one or more etchants such as chlorine-containing gas, a bromine-containing gas, and/or a fluorine-containing gas. The etching process allows the source/drain metal contacts 56 to be selectively etched from the sacrificial SAC layer 50, the metal gate liner 48, the CESL 38, or the ILD layer 40 when exposed.

The source/drain metal contacts 56 have a height H2 after etch back. In some embodiments, the source/drain metal contacts 56 may have a height H2 in a range between about 0.5 nm and about 90 nm.

The isolation features 60 may include a low-k dielectric material, for example, a dielectric material having a dielectric constant lower than that of silicon oxide (SiOx; x is greater than 0 but smaller than or equal to 2). The isolation features 60 may be removed in subsequent process and serve as self-alignment feature for contact holes to connect with the source/drain metal contacts 56. In some embodiments, the isolation features 60 may include a dielectric material that can be selectively removed from the sacrificial SAC 50 during the subsequent process. In some embodiments, the isolation features 60 may include but not limited to SiO, SiN, SiC, SiCN, SiOC, SiON, SiCN, SiOCN, ZrO, ZrN, or a combination thereof. The isolation features 60 may be formed by a suitable deposition process, such as CVD, PVD, plating, ALD, or other suitable technique.

Subsequently, a CMP process is performed to remove a portion of the dielectric material of the isolation features 60 above a top surface of the sacrificial SAC layer 50. In some embodiments, the low-k isolation features 60 may have a height H3 in a range between about 0.5 nm and about 30 nm.

Figure 13A:
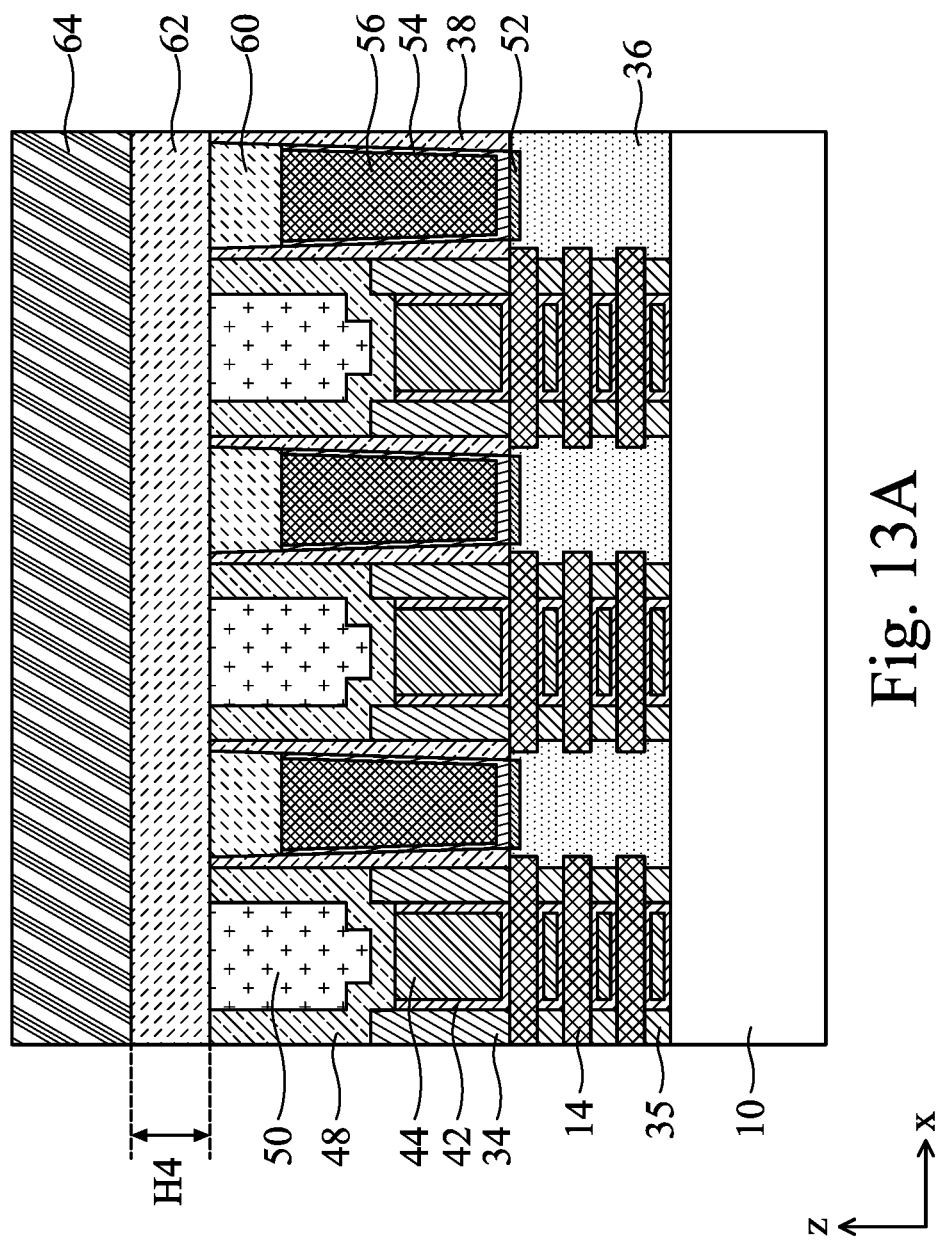
Figure 13C:
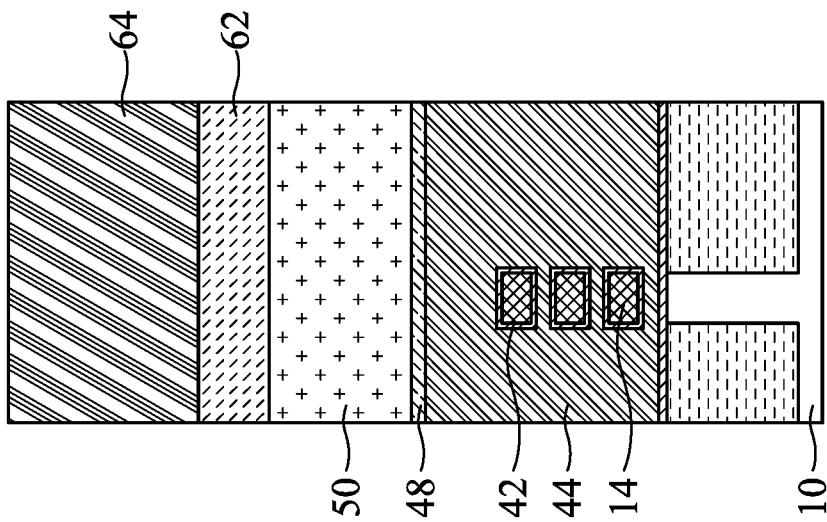
Figure 13B:
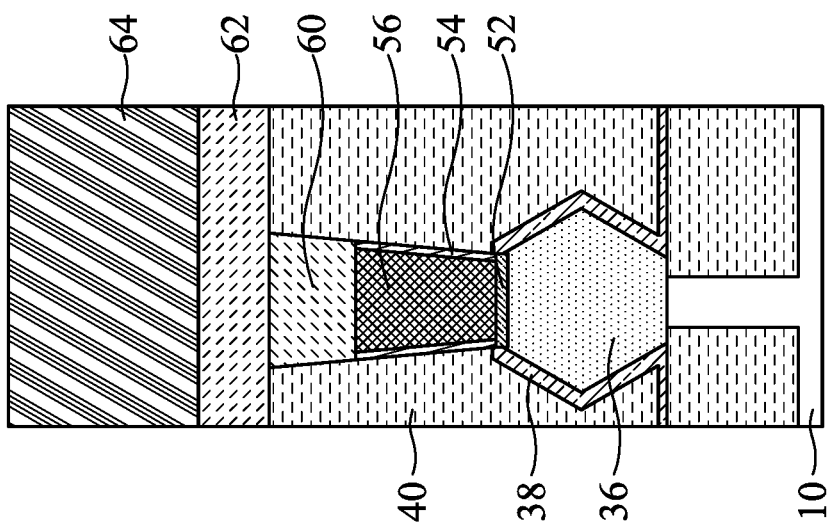

In operation 120, a sacrificial metal contact etch stop layer (M-CESL) 62 is formed over the sacrificial SAC 50 and the isolation features 60, and a second ILD layer 64 is formed over the sacrificial M-CESL 62 as shown in FIGS. 13A-C. The sacrificial M-CESL 62 and second ILD layer 64 are used to form trenches and vias for the metal layer.

The sacrificial M-CESL 62 may include $Si_3N_4$, SiON, SiCN or any other suitable material, and may be formed by CVD, PVD, or ALD. In some embodiments, the sacrificial M-CESL 62 may be formed from a high-k dielectric material. In some embodiments, the sacrificial M-CESL 62 may be formed from a material having etch selectivity with the second ILD layer 64 and the sacrificial SAC layer 50 so that the sacrificial M-CESL 62 functions as an etch stop layer when patterning the second ILD layer 64, and the sacrificial SAC layer 50 functions as an etch stop layer when etching the sacrificial M-CESL 62 in the subsequent patterning process. In some embodiments, the sacrificial M-CESL 62 may have a height H4 in a range between about 0.5 nm and about 50 nm. The sacrificial M-CESL 62 may not be thick enough to function as an etch stop layer when the height H4 is less than 0.5 nm. When the height H4 is greater than 50 nm, no additional benefit can be achieved with increased cost.

The second ILD layer 64 is formed over the sacrificial M-CESL 62. The materials for the second ILD layer 64 include compounds comprising Si, O, C, and/or H, such as silicon oxide, SiCOH and SiOC. Organic materials, such as polymers, may be used for the second ILD layer 64.

Figure 14A:
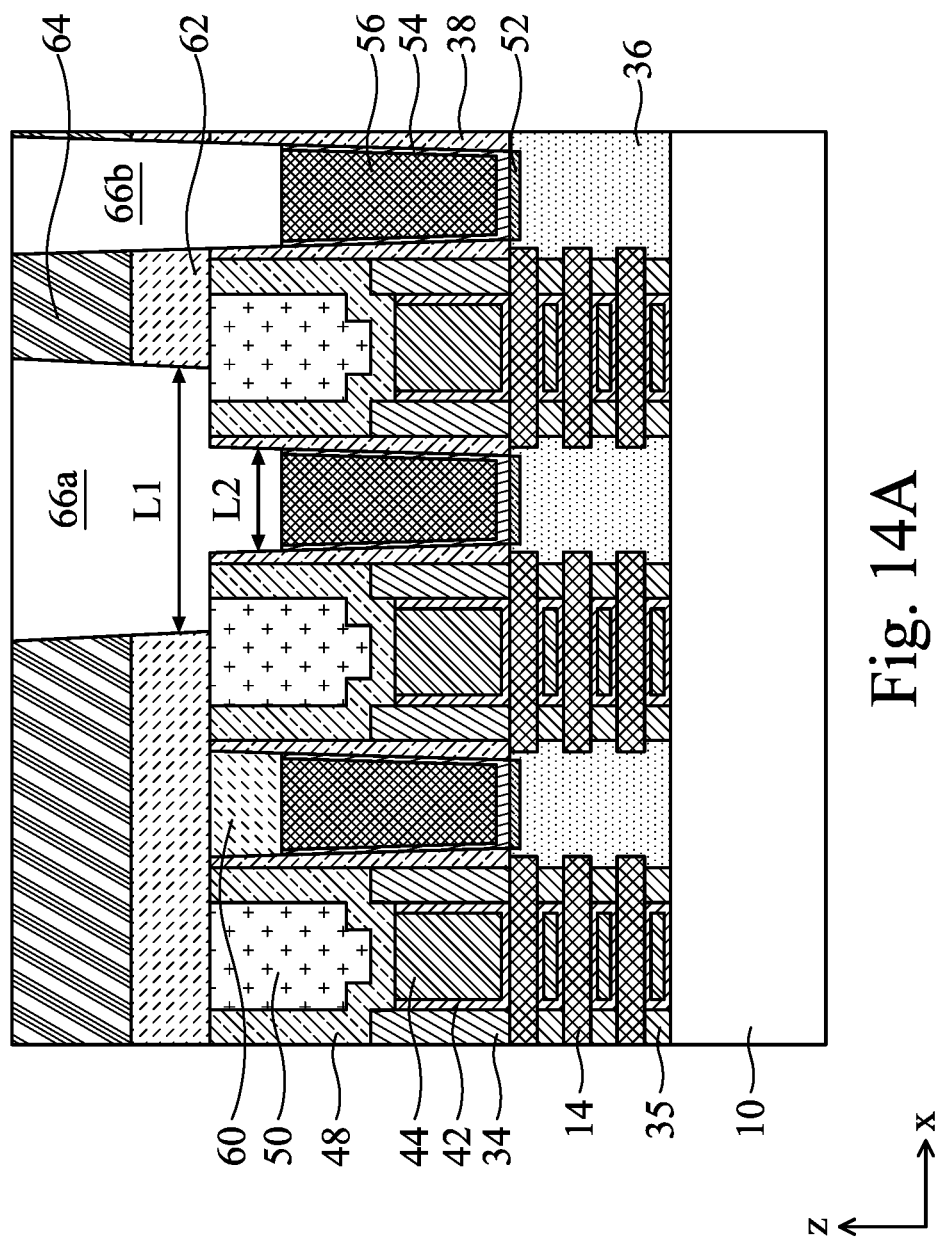
Figure 15A:
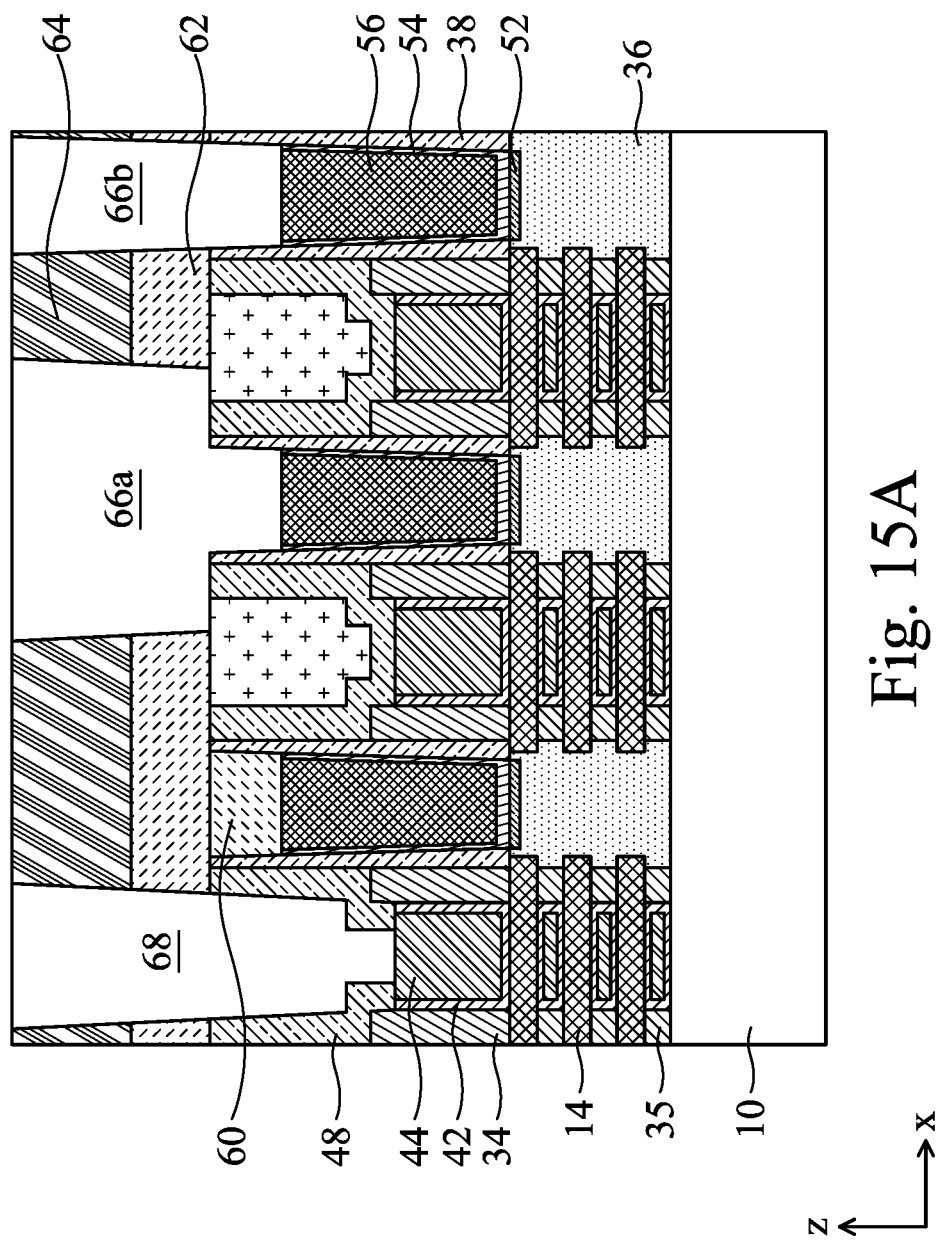

In operation 122, metal contact openings 66a, 66b and gate contact openings 68 are formed as shown in FIGS. 14A-C and 15A-C. The metal contact openings 66a, 66b may be trenches and vias formed through the second ILD layer 64 and the sacrificial M-CESL 62 for forming conductive features to connect with selected source/drain metal contacts 56. The gate contact openings 68, shown in FIGS. 15A and 15C, are openings through the second ILD layer 64, the sacrificial M-CESL 62, and the sacrificial SAC layer 50 to form conductive features to connect with the gate electrode layer 44. In some embodiments, the gate contact openings 68 and the metal contact openings 66a, 66b may be formed using separate patterns.

As shown in FIGS. 14A and 14B, the metal contact openings 66a, 66b are formed using a patterning process, such as a damascene patterning process. In some embodiments, a photolithography process is performed to form a patterned mask layer (not shown) over the second ILD layer 64. The pattern in the patterned mask is then transferred to the second ILD layer 64 using a suitable etching process while the sacrificial M-CESL 62 serves an etch stop.

After the pattern is formed through the second ILD layer 64, a second etching process is performed to remove portions of the sacrificial M-CESL 62 not covered by the patterned second ILD layer 64 and the isolation feature 60 uncovered after removal of the portions of the sacrificial M-CESL 62. As discussed above, the sacrificial SAC layer 50 is selected from materials that functions as an etch stop when removal of the isolation feature 60. Similarly, the ILD layer 40 may also serve as an etch stop during the etch process to remove the sacrificial M-CESL 62 and the isolation feature 60. As a result, the metal contact openings 66a, 66b may have a larger width W1 and/or length L1 through the sacrificial M-CESL 62 and a smaller width W2 and/or length L2 in the ILD layer 40. The lower portion of the metal contact openings 66a, 66b has the dimension of the removed isolation feature 60.

The gate contact opening 68 may be formed after formation of the metal contact openings 66a, 66b using a patterning process, such as a damascene patterning process. In some embodiments, a second photolithography process is performed to form a second patterned mask layer (not shown) over the second ILD layer 64. The metal contact openings 66a, 66b may be covered the second patterned mask layer. The pattern in the second patterned mask is then transferred through the second ILD layer 64, the sacrificial M-CESL 62, the sacrificial SAC layer 50, the metal gate liner 48 using one or more suitable etching processes to form the gate contact opening 68. As shown in FIGS. 15A and 15C, the gate contact opening 68 exposes a top surface of the gate electrode layer 44. Alternatively, the gate contact opening 68 may be formed before formation of the metal contact openings 66a, 66b.

Figure 16A:
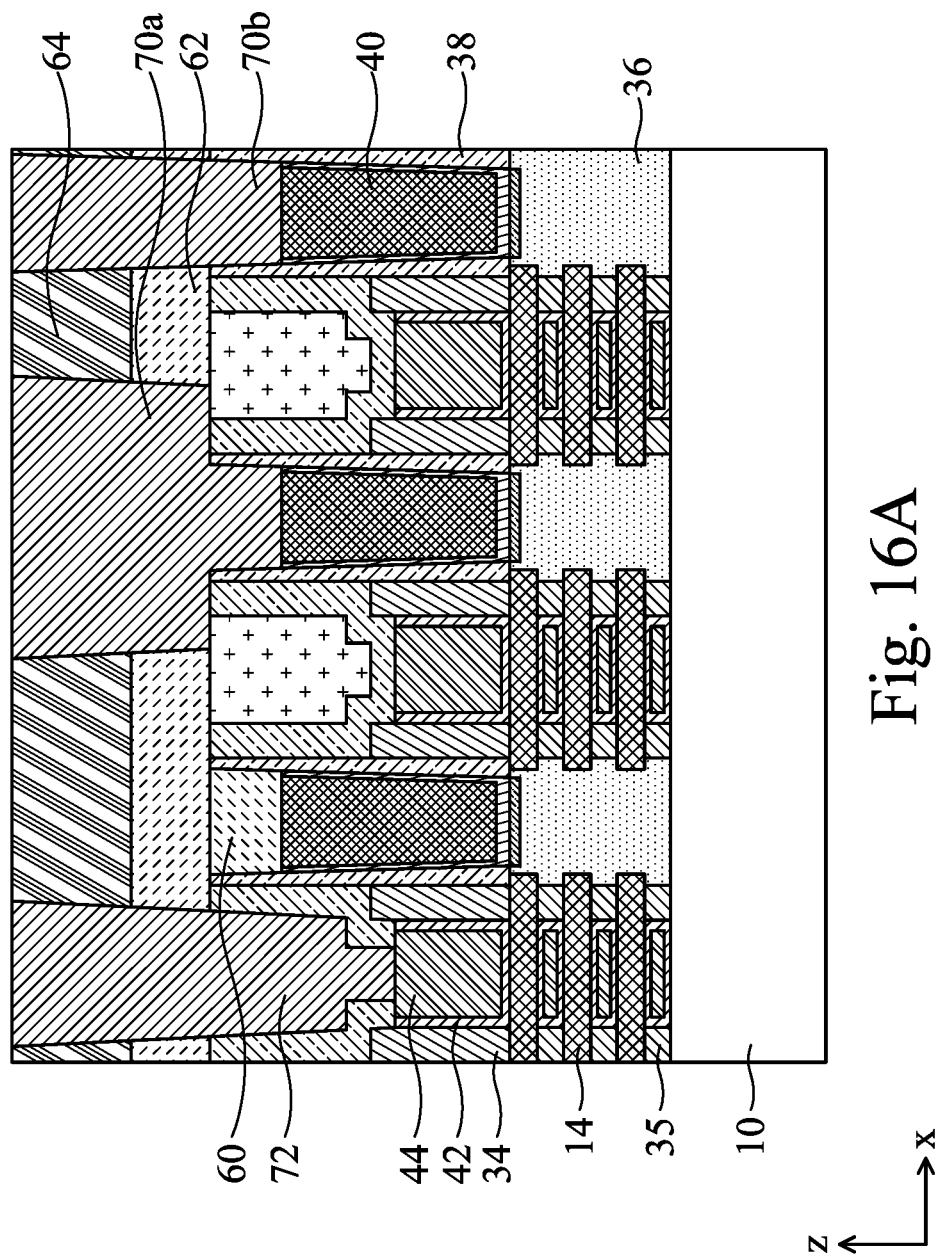
Figure 16C:
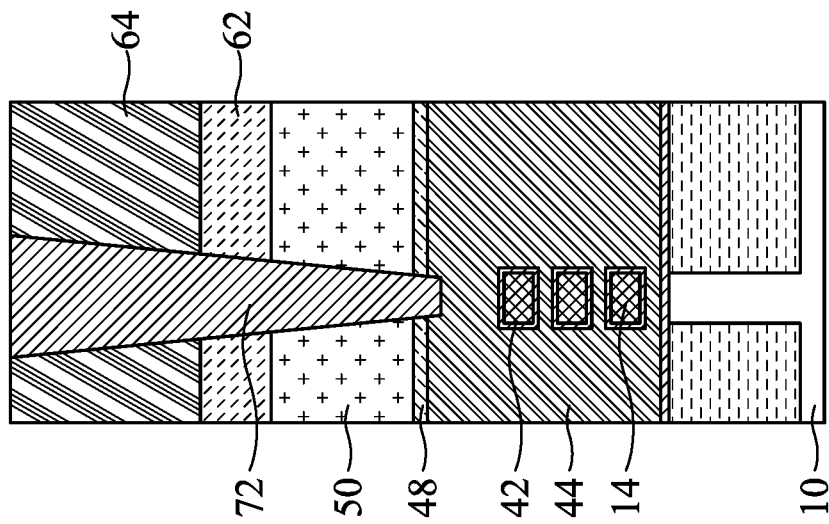
Figure 16B:
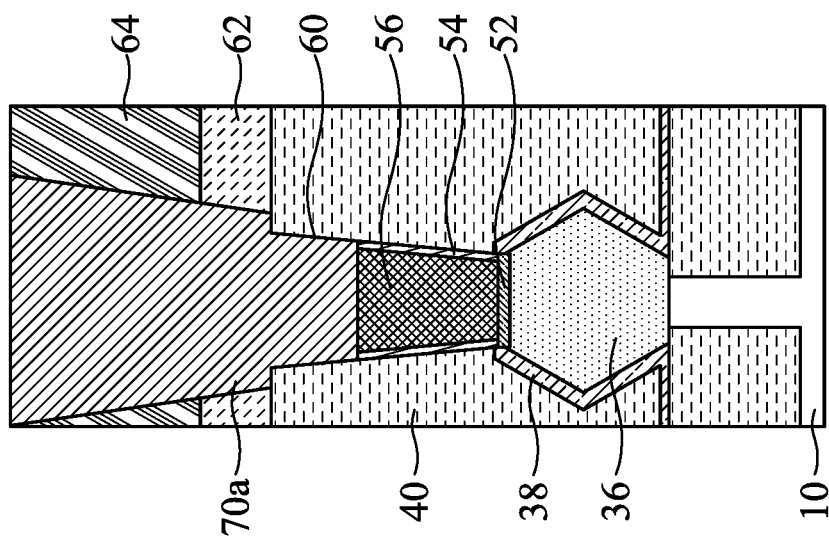

In operation 124, after formation of the metal contact openings 66a, 66b and gate contact openings 68, a conductive material is deposited to fill the metal contact openings 66a, 66b and gate contact openings 68 and form gate contacts 72 and conductive features 70a, 70b, as shown in FIGS. 16A-C. In some embodiments, the conductive material for the gate contacts 72 and conductive features 70a, 70b includes but not limited to W, Co, Ru, Ti, Ni, Cu, Au, Ag, Pt, Pd, Ir, Os, Rh, Al, Mo, or the like. The conductive material may be formed by a suitable deposition process, such as CVD, PVD, plating, ALD, or other suitable technique.

In some embodiments, a barrier layer (not shown) may be formed over surfaces of the metal contact openings 66a, 66b and gate contact openings 68 prior to filling conductive material. In some embodiments, the barrier layer may be formed from Ti, Ta, TiN, TaN, W, Co, Ru, or the like. The barrier layer may have a thickness less than about 10 nm.

Figure 17A:
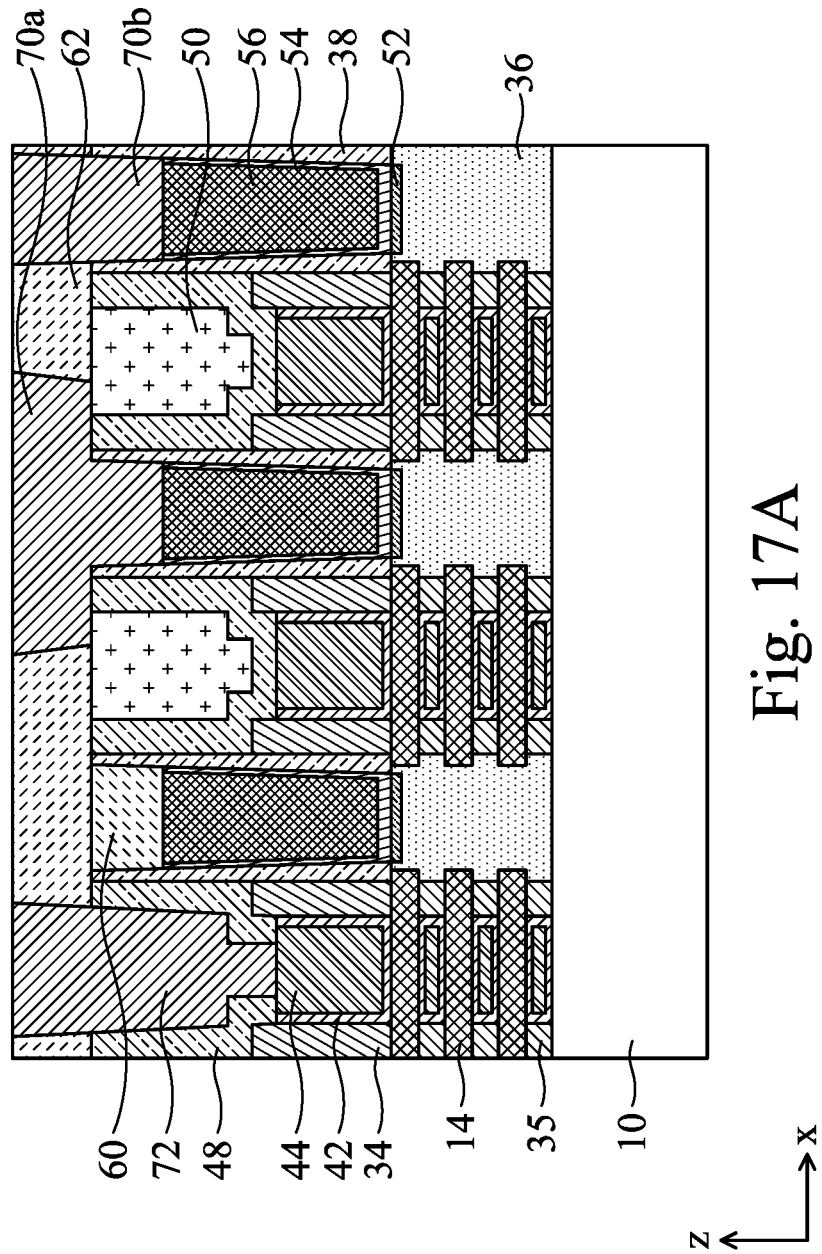
Figure 17B:
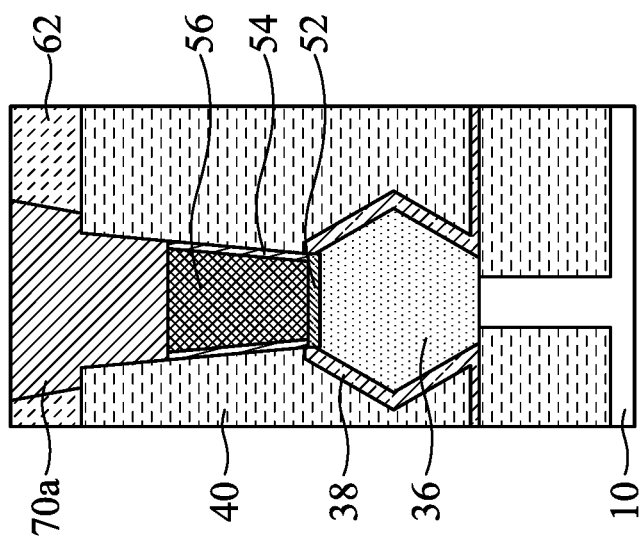
Figure 17C:
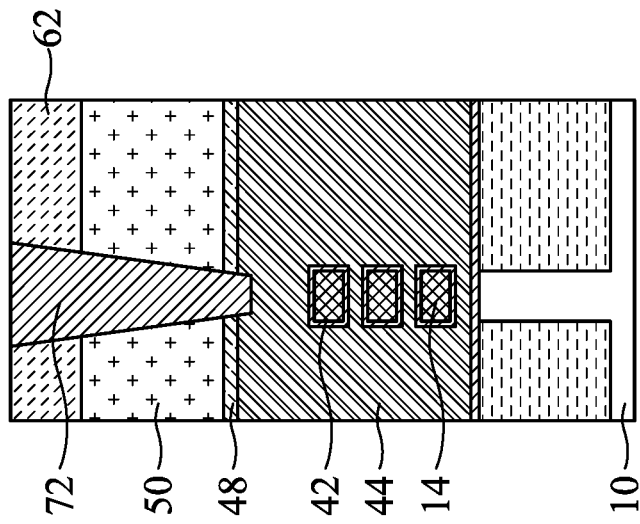

In operation 126, a planarization process, such as a CMP process, is performed to remove a portion of the gate contacts 72 and conductive features 70a, 70b and expose the sacrificial M-CESL 62, as shown in FIGS. 17A-17C.

In operation 128, one or more etch processes are performed to remove the sacrificial M-CESL 62 and the sacrificial SAC layer 50, as shown in FIGS. 18A-18C and 19A-19C. The sacrificial M-CESL 62 and the sacrificial SAC layer 50 may be removed using one suitable etching process or using two separated suitable etching processes. FIGS. 19D-22D are cross sectional views of the device along D-D line of FIG. 19A. FIGS. 19E-22E are cross sectional views of the device along E-E line of FIG. 19A.

Figure 18A:
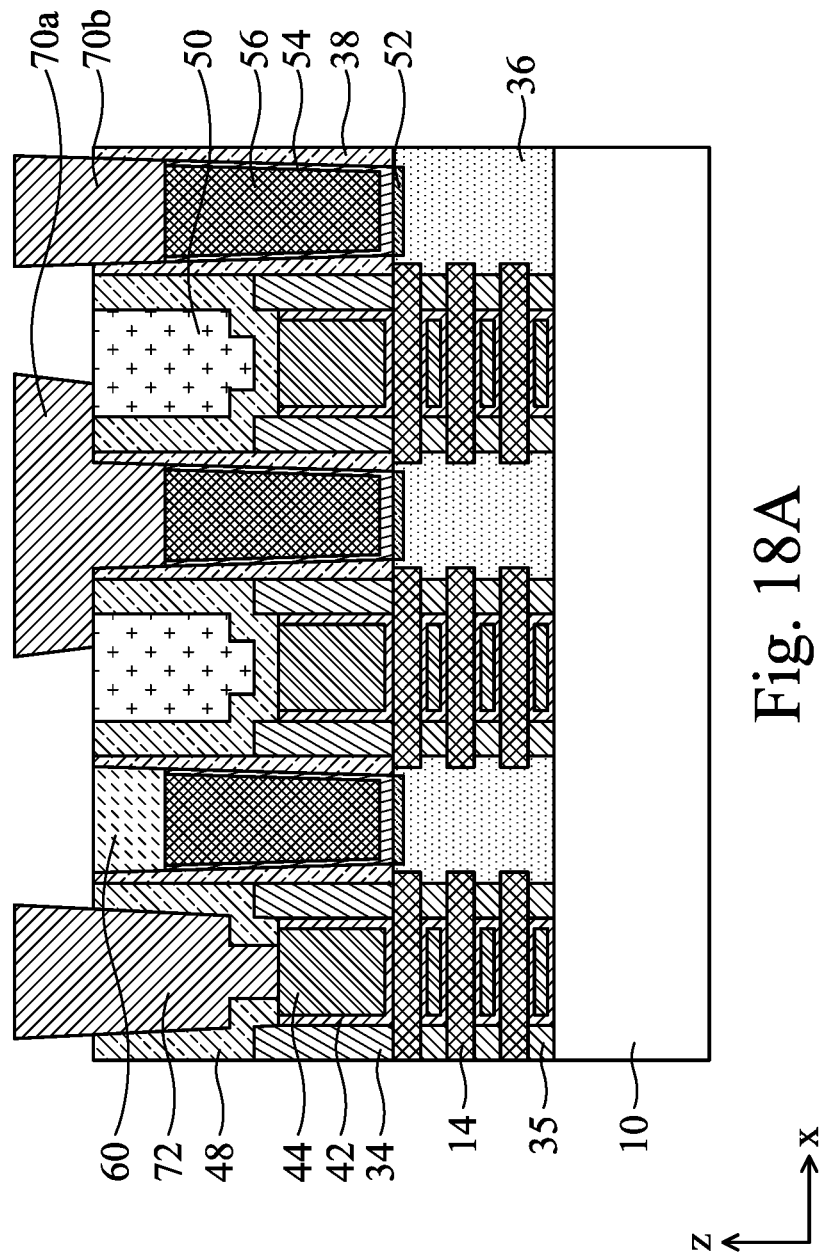
Figure 19A:
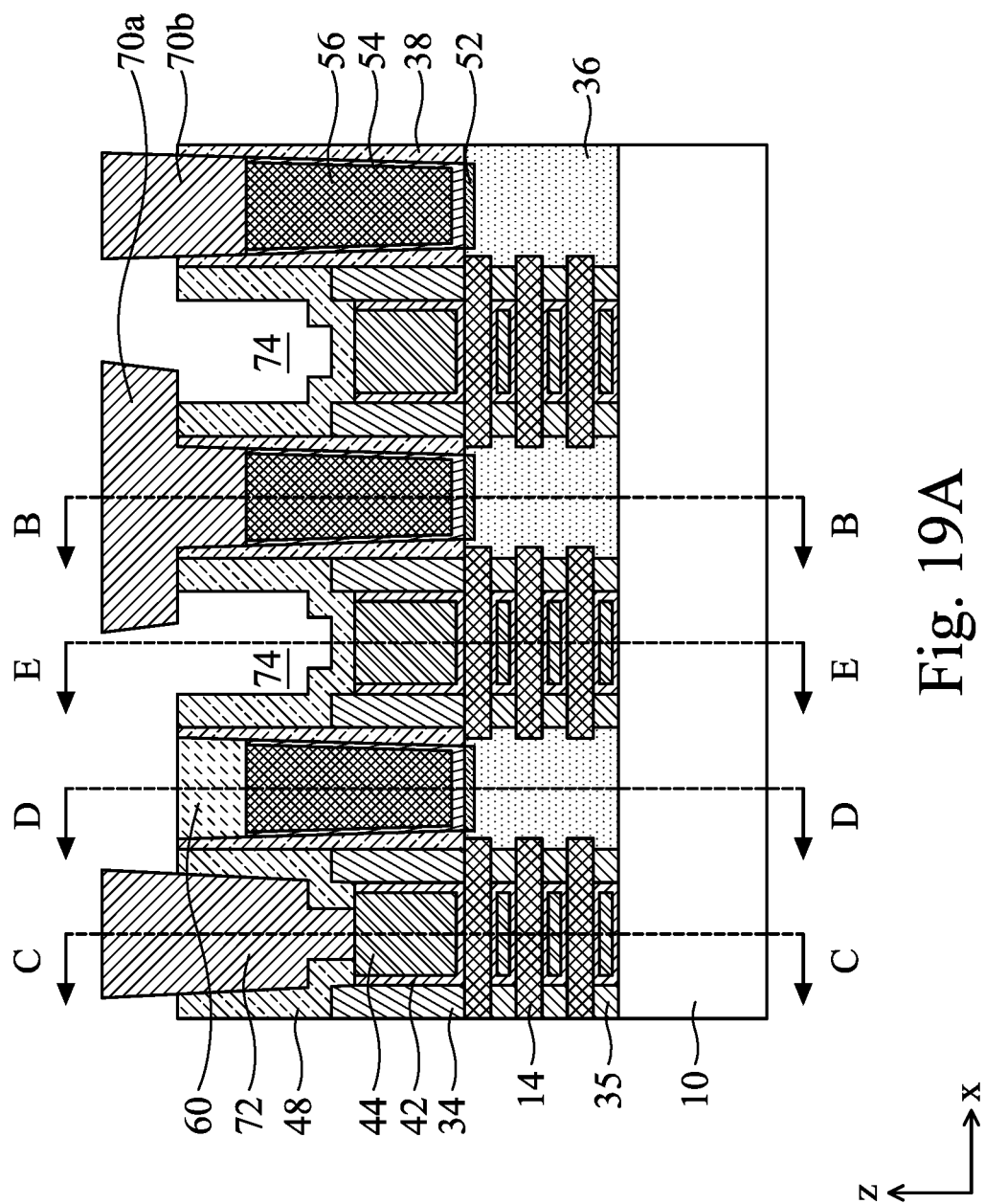
Figure 19C:
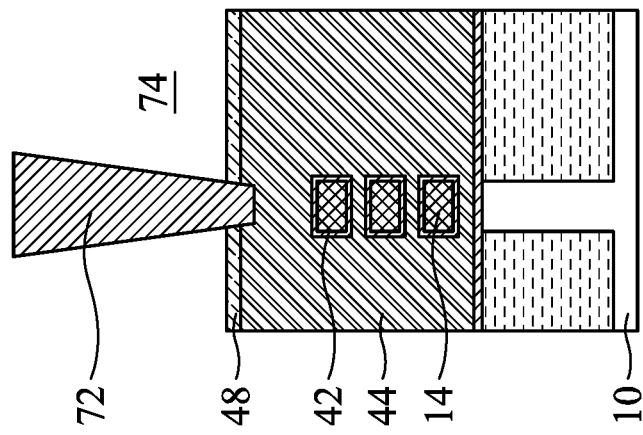
Figure 19B:
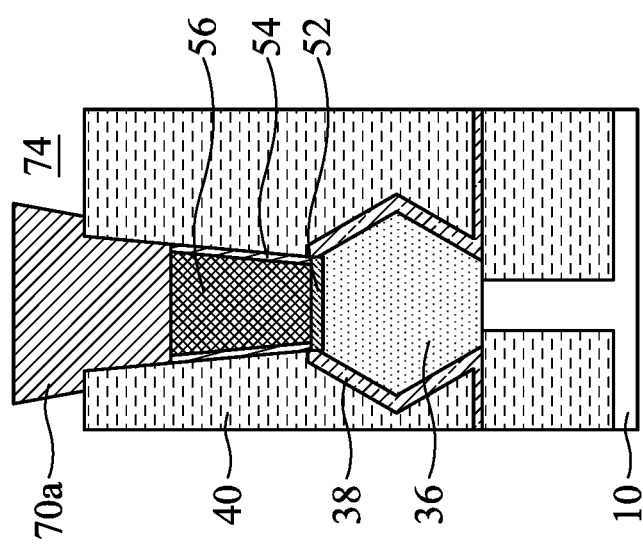
Figure 20A:
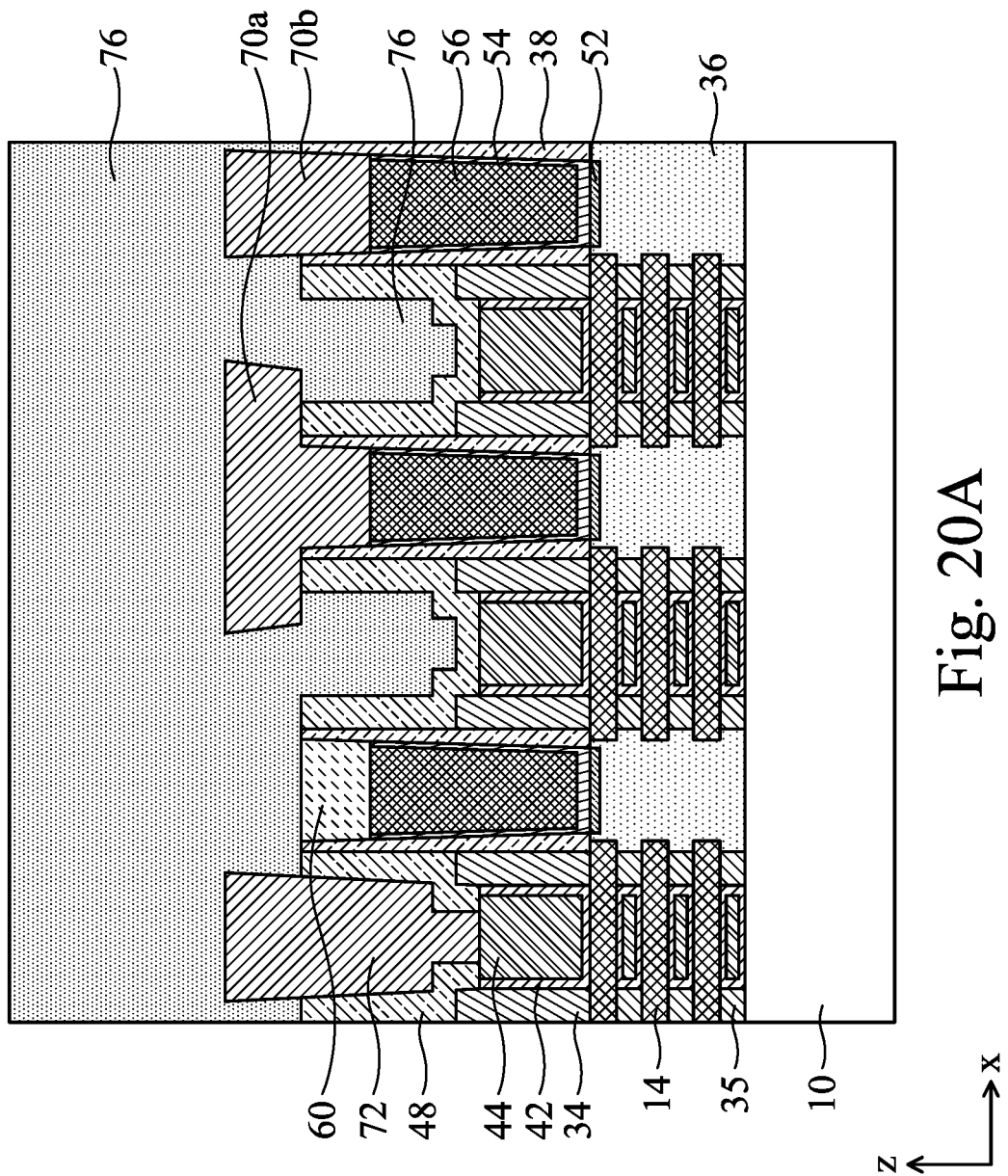
Figure 20D:
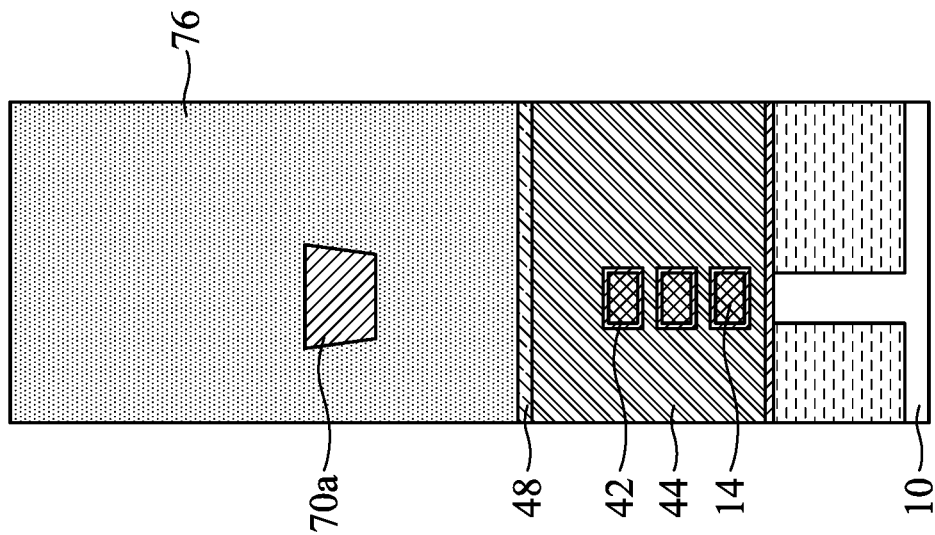
Figure 20E:
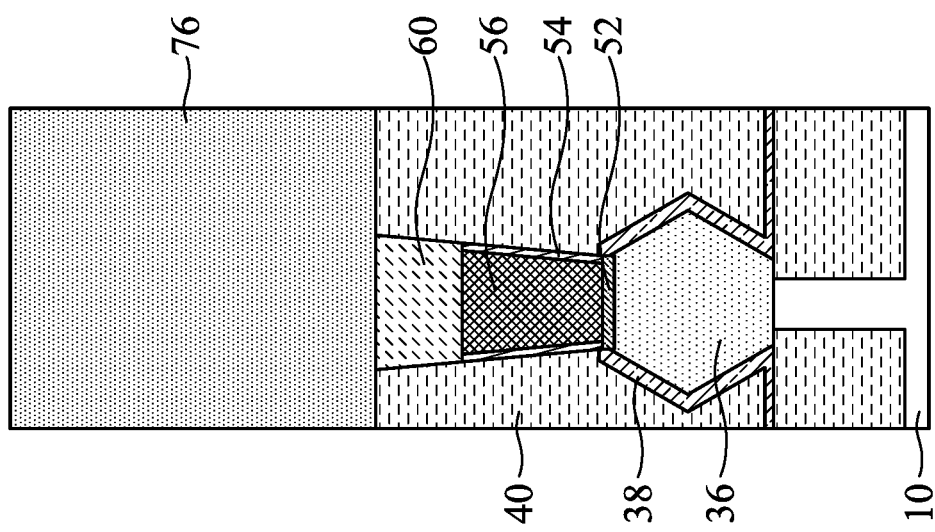

When the sacrificial M-CESL 62 is removed, top surfaces of the metal gate liner 48, the CESL 38, the ILD layer 40, the isolation features 60, and the sacrificial SAC layer 50 are exposed to etching agent as shown in FIGS. 18A-C. The sacrificial SAC layer 50 is selectively removed without removing the metal gate liner 48, the CESL 38, the ILD layer 40 and the isolation features 60. After the removal of the sacrificial SAC layer 50, cavities 74 are formed above the gate electrode layer 44. The cavities 74 are defined by the gate metal liner 48, as shown in FIGS. 19A-19E. Portions of the conductive features 70a may hang over some cavities 74.

In operation 130, a low-k dielectric layer 76 is deposited to fill the cavities 74 and cover the gate contacts 72 and conductive features 70a, 70b, as shown in FIGS. 20A-20E. The low-k dielectric layer 76 may include one or more dielectric material having a dielectric constant lower than that of silicon oxide (SiOx; x is greater than 0 but smaller than or equal to 2). The low-k dielectric layer 76 may be formed by a suitable deposition process, such as CVD, PVD, plating, ALD, or other suitable technique. In some embodiments, the low-k dielectric layer 76 is deposited by ALD to ensure that the cavities 74 are filled. The low-k dielectric layer 76 may be a low-k dielectric material including but not limited to SiO, SiN, SiC, SiCN, SiOC, SiON, SiCN, SiOCN, ZrO, ZrN, or a combination thereof. In some embodiments, the low-k dielectric layer 76 and isolation features 60 may be formed from the same material.

After deposition of the low-k dielectric layer 76, a planarization process, such as a CMP process, is performed to remove a portion of the low-k dielectric layer 76 the gate contacts 72 and conductive features 70a, 70b, as shown in FIGS. 21A-21E.

After operation 130, the low-k dielectric layer 76 includes a M-CESL portion 76m and SAC layer portions 76s. The M-CESL portion 76m replaces the sacrificial M-CESL 62. The SAC layer portions 76s replace the sacrificial SAC layer 50. The M-CESL portion 76m is defined between a top surface 76t and a lower surface 76b. The top surface 76t, formed after the CMP process, is at the same level with top surfaces of the gate contacts 72 and conductive features 70a, 70b. The lower surface 76b refers to the surface where the low-k dielectric layer 76 contacts top surfaces of the ILD 40 and the isolation features 60. The M-CESL portion 76m extends upward from the lower surface 76b to the top surface 76t. The SAC layer portions 76s extend downward from the lower surface 76b. The SAC layer portion 76s of the low-k dielectric layer 76 contacts the metal gate liner 48. In some instances, the SAC layer portions 76s is in contact with the conductive feature 70a.

Figure 21A:
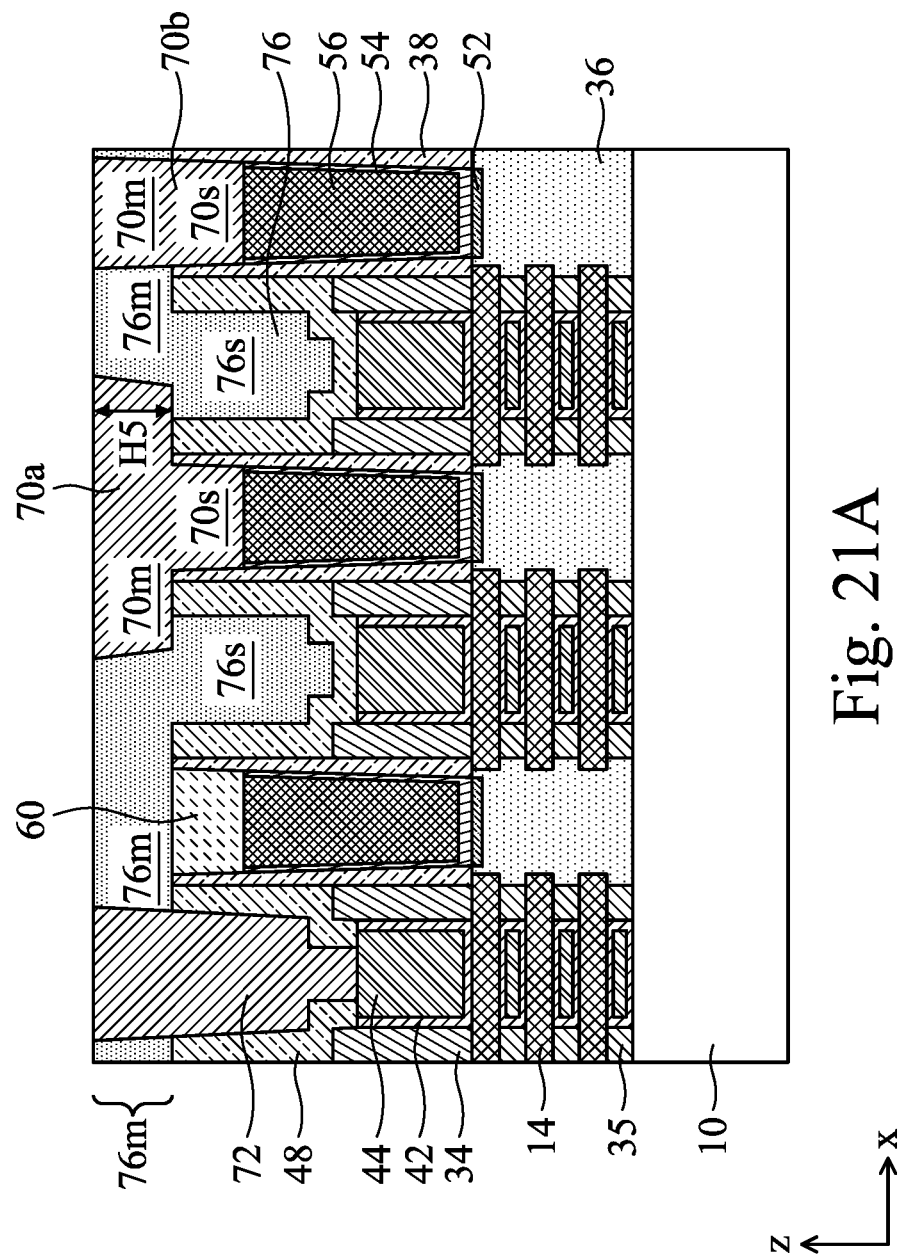
Figure 22A:
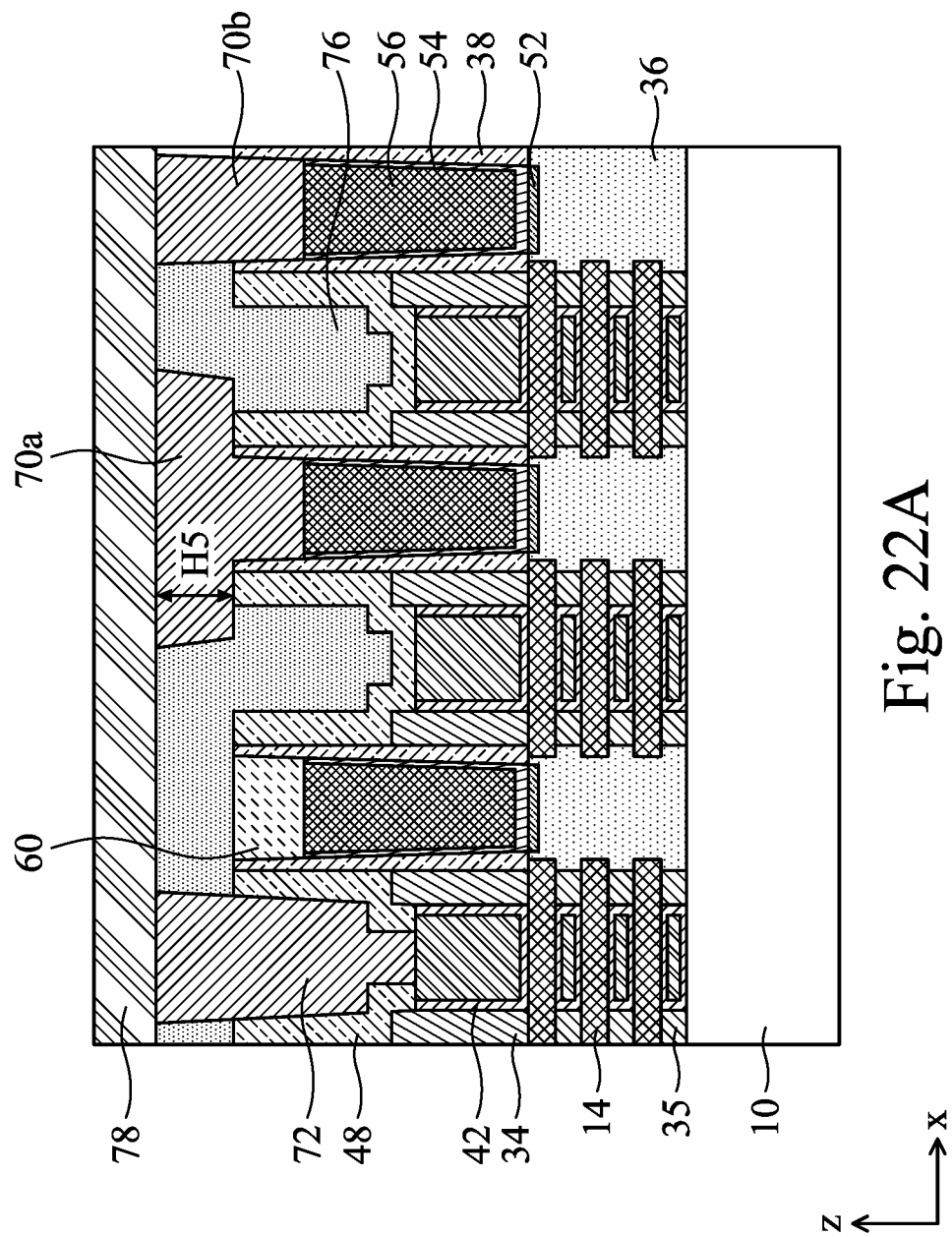
Figure 22E:
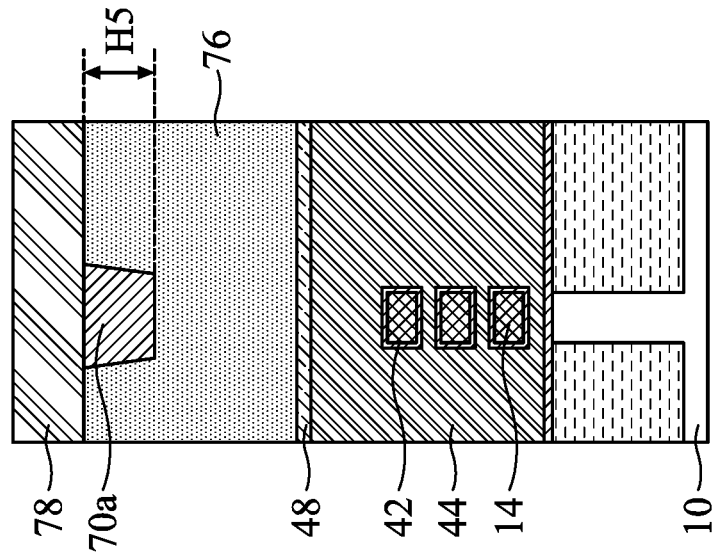
Figure 22D:
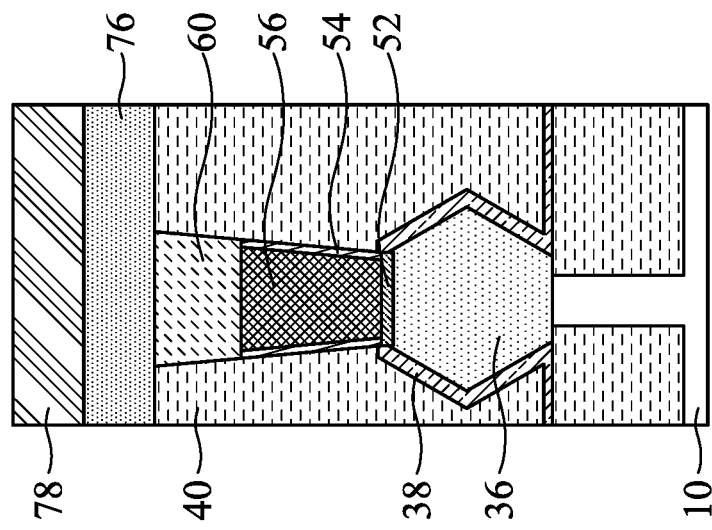

The M-CESL portion 76m has a height H5 in a range between about 0.5 nm and about 50 nm. The conductive feature 70a, 70b has a portion 70m embedded in the M-CESL portion 76m of the low-k dielectric layer 76, and a portion 70s embedded in the ILD layer 40. The M-CESL portion 76m of the low-k dielectric layer 76 is in contact with the ILD layer 40, the isolation feature 60, and the CESL 38 at the lower surface 76b, as shown in FIGS. 21A, 21B, and 21D. An etch stop layer or an ILD layer may be subsequently formed over a top surface 76t of M-CESL portion 76m to form subsequent structures, such as an interconnect structure.

As shown in FIGS. 21A and 21B, the portion 70m of the conductive feature 70a is wider than the portion 70s of the conductive feature 70a, and the portion 70m of the conductive feature 70a has a height substantially the same as the M-CESL portion 76m. By using the sacrificial M-CESL 62 and the sacrificial SAC layer 50, the portion 76m of the conductive feature 70a has increased width and reduced height, as a result, the resistance of the conductive feature 70a is reduced. By replacing the sacrificial M-CESL 62 and the sacrificial SAC layer 50 with the low-k dielectric layer 76, the capacitance of the device also reduced. With reduced resistance and capacitance, the performance of the device is improved.

In operation 132, an interconnect structure 78 may be formed over the low-k dielectric layer 76, the gate contacts 72, and the conductive features 70a, 70b, as shown in FIGS. 22A-22E. The interconnect structure 78 may include multiple sets of inter-layer dielectric (ILD) layers and inter-metal dielectrics (IMDs) layers. The interconnect structure 78 includes metal lines and vias for connecting the signal lines and/or power rails to the gate contacts 72 and conductive features 70a, 70b.

Figure 23:
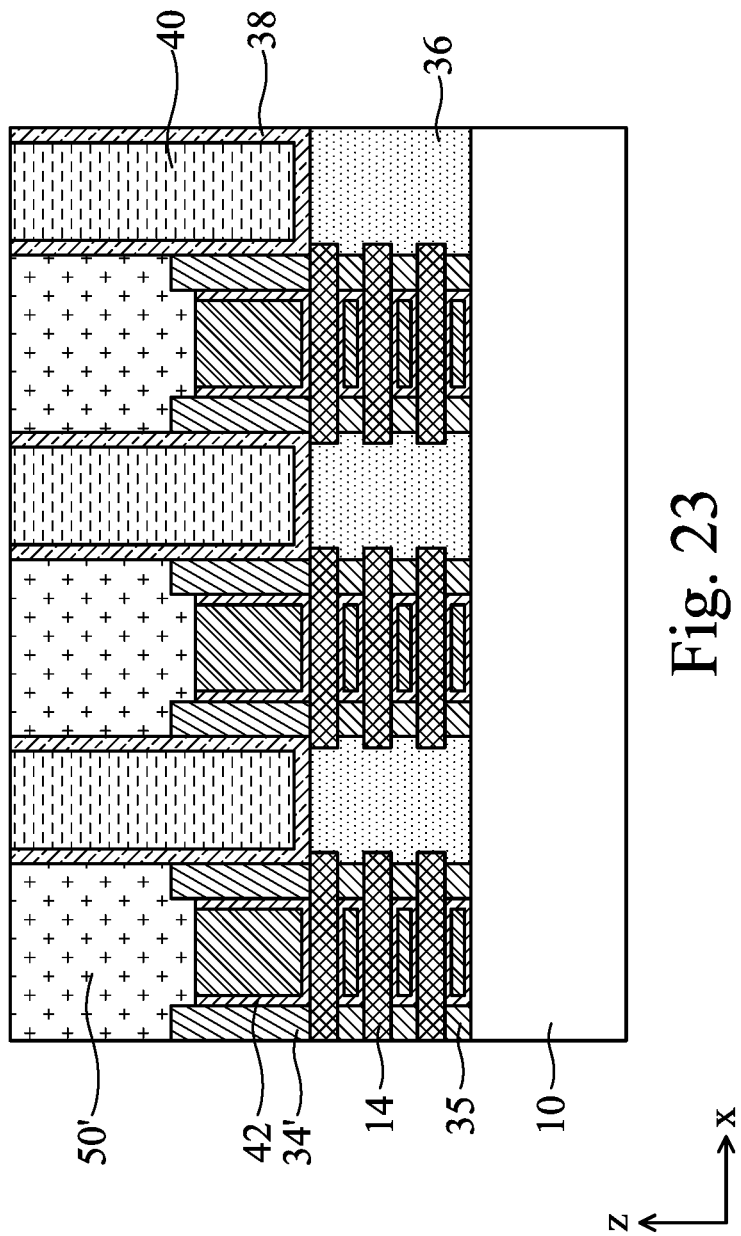
FIGS. 23-24 schematically illustrate various stages of manufacturing a semiconductor device according to another embodiment of the present disclosure.
Figure 24:
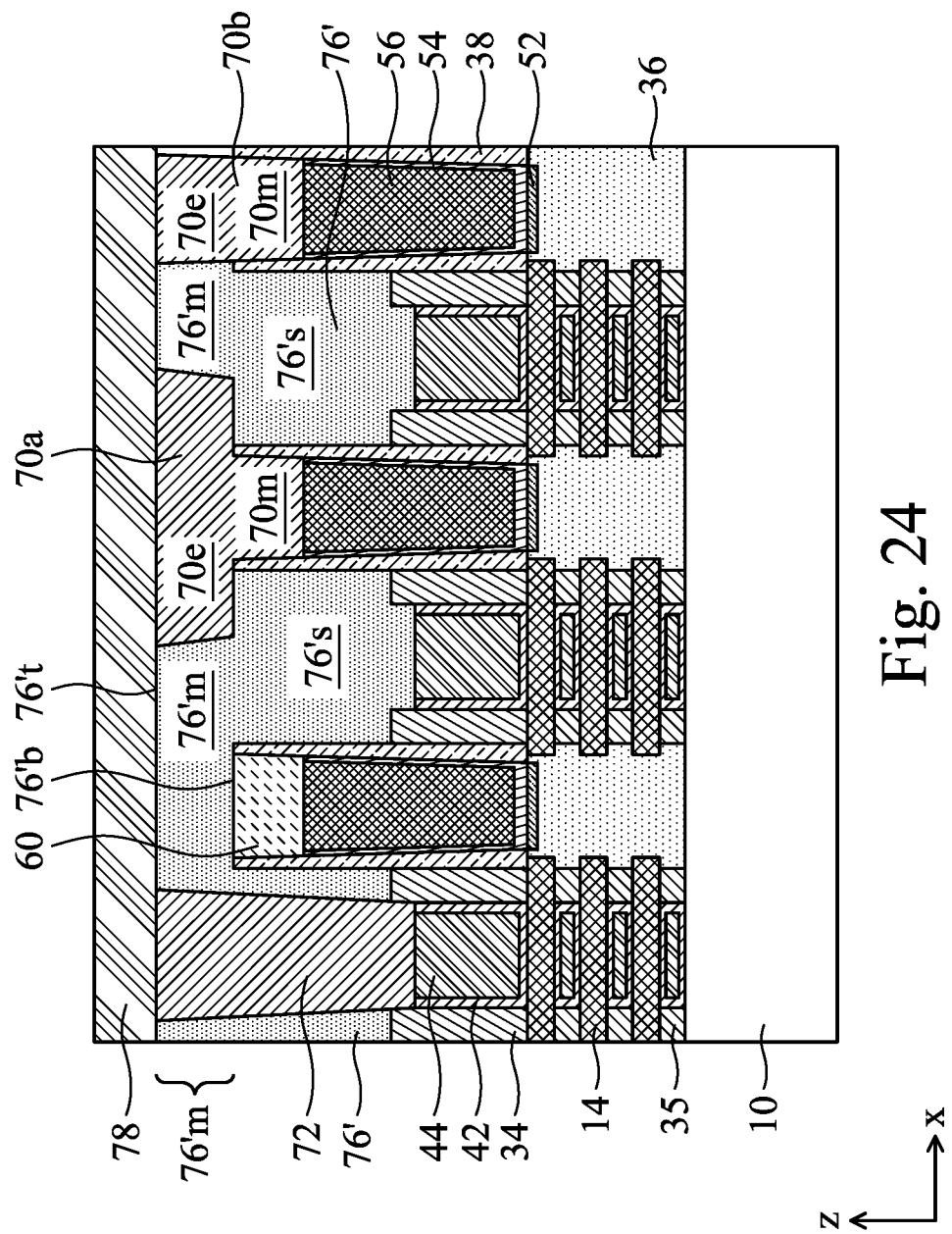

FIGS. 23-24 schematically illustrate various stages of manufacturing a semiconductor device according to another embodiment of the present disclosure. The semiconductor device in FIGS. 23-24 are similar to the semiconductor devices according to FIGS. 2-22 except that the metal gate liner 48 is omitted.

FIG. 23 schematically reflects the semiconductor device after operation 114 wherein a sacrificial SAC layer 50' is formed directly over the gate electrode layer 44 without any metal gate liner. The sacrificial SAC layer 50' is in contact with the gate electrode layer 44, the gate dielectric layer 42, the sidewall spacers 34 and the CESL 38.

FIG. 24 reflects the semiconductor device after operation 132. A low-k dielectric layer 76' is formed in place of the low-k dielectric layer 76 shown in FIGS. 21A-E and 21A-E.

After operation 130, the low-k dielectric layer 76' includes a M-CESL portion 76'm and SAC layer portions 76's. The M-CESL portion 76'm replaces the sacrificial M-CESL 62. The SAC layer portions 76's replace the sacrificial SAC layer 50'. The M-CESL portion 76'm is defined between a top surface 76't and a lower surface 76'b. The top surface 76't, formed after the CMP process, is at the same level with top surfaces of the gate contacts 72 and conductive features 70a, 70b. The lower surface 76'b refers to the surface where the low-k dielectric layer 76' contacts top surfaces of the ILD 40 and the isolation features 60. The SAC layer portions 76's extend downward from the lower surface 76'b. The SAC layer portion 76's of the low-k dielectric layer 76' contacts the gate electrode layer 44, the gate dielectric layer 42, the sidewall spacers 34, and the CESL 38. In some instances, the SAC layer portions 76's is in contact with the conductive feature 70a.

The M-CESL portion 76'm of is similar to the M-CESL portion 76m in FIGS. 21A-E and 21A-E. Each conductive feature 70a, 70b has a portion 70m embedded in the M-CESL portion 76'm of the low-k dielectric layer 76'. The M-CESL portion 76'm of the low-k dielectric layer 76' is in contact with the ILD layer 40, the isolation feature 60, and the CESL 38 at the lower surface 76'b, as shown in FIG. 24. An etch stop layer or an ILD layer may be subsequently formed over a top surface 76't of M-CESL portion 76'm to form subsequent structures, such as an interconnect structure.

Figure 25:
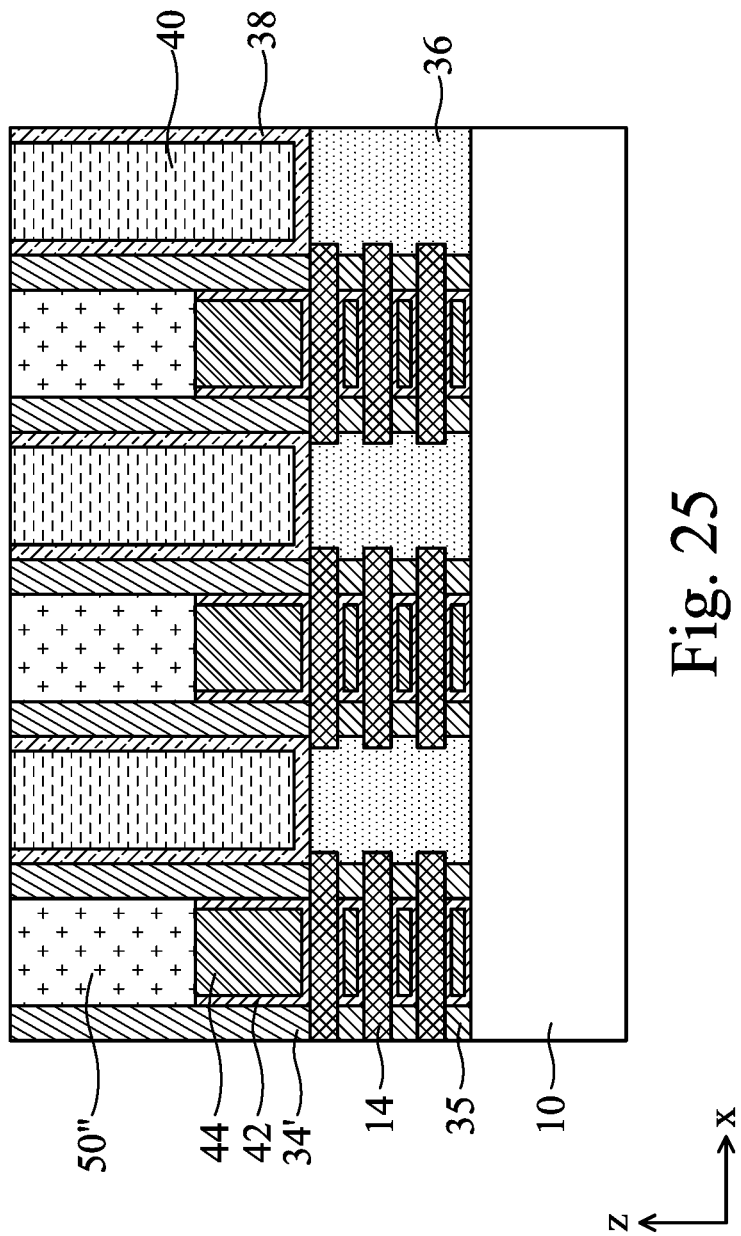
FIGS. 25-26 schematically illustrate various stages of manufacturing a semiconductor device according to another embodiment of the present disclosure.
Figure 26:
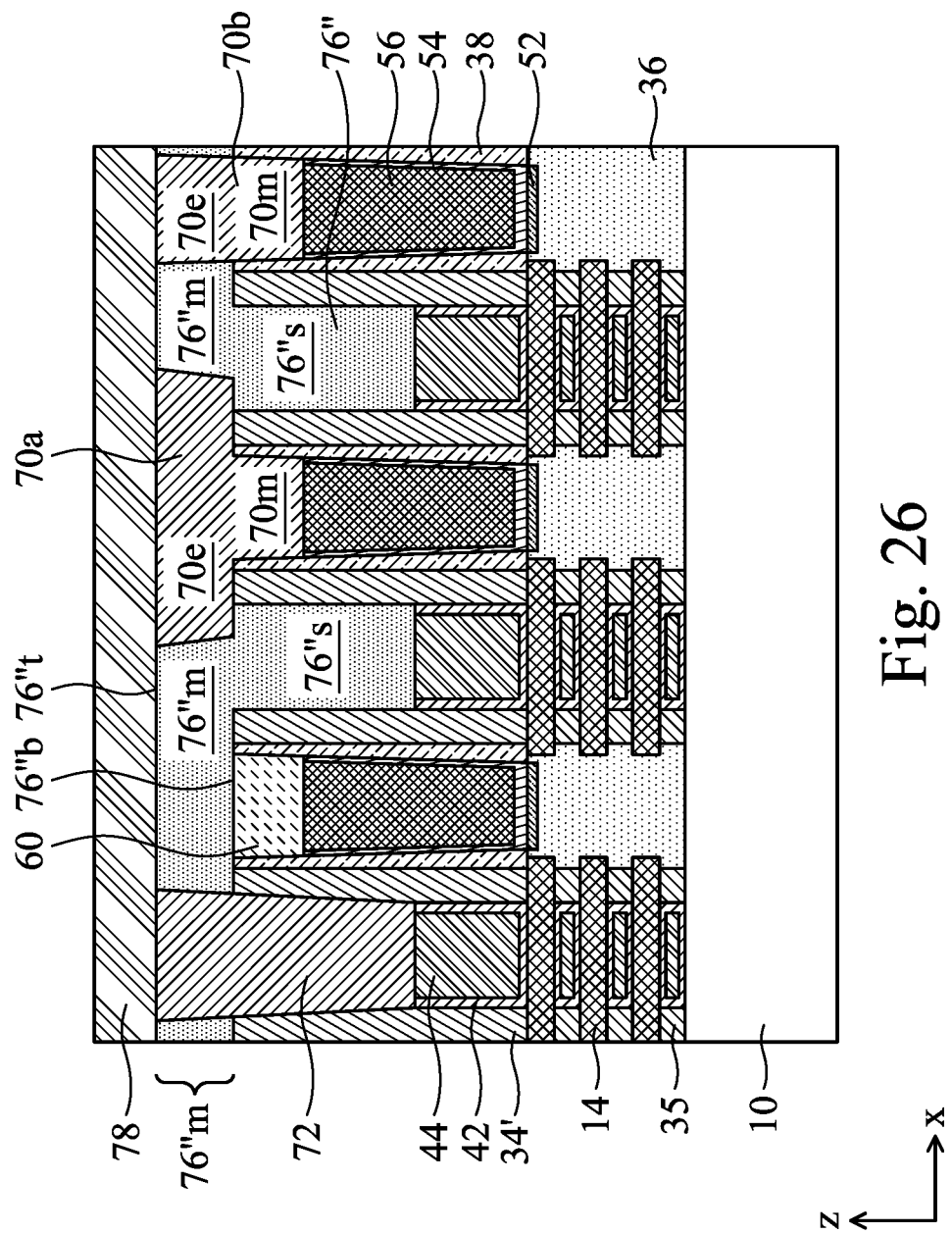

FIGS. 25-26 schematically illustrate various stages of manufacturing a semiconductor device according to another embodiment of the present disclosure. The semiconductor device in FIGS. 25-26 are similar to the semiconductor devices according to FIGS. 2-22 and the semiconductor devices according to FIGS. 23-24 and except that the metal gate liner 48 is omitted and the sidewall spacers 34' are not etched back.

FIG. 25 schematically reflects the semiconductor device after operation 114 wherein a sacrificial SAC layer 50" is formed directly over the gate electrode layer 44 without etching back the sidewall spacers 34' and without forming any metal gate liner. The sidewall spacers 34' may be formed from a material that has an etch selectively relative to the ILD layer 40 and the isolation features 60 so that the sidewall spacers 34 are not damaged during formation of the source/drain metal contacts 56, e.g. in operation 116, and during formation of the metal contact openings 66a, 66b, e.g. in operation 122. The sacrificial SAC layer 50" is in contact with the gate electrode layer 44, the gate dielectric layer 42, and the sidewall spacers 34.

FIG. 26 reflects the semiconductor device after operation 132. A low-k dielectric layer 76" is formed in place of the low-k dielectric layer 76 shown in FIGS. 21A-E and 21A-E and the low-k dielectric layer 76' shown in FIG. 24.

After operation 130, the low-k dielectric layer 76" includes a M-CESL portion 76"m and SAC layer portions 76"s. The M-CESL portion 76"m replaces the sacrificial M-CESL 62. The SAC layer portions 76"s replace the sacrificial SAC layer 50". The M-CESL portion 76"m is defined between a top surface 76"t and a lower surface 76"b. The top surface 76"t, formed after the CMP process, is at the same level with top surfaces of the gate contacts 72 and conductive features 70a, 70b. The lower surface 76"b refers to the surface where the low-k dielectric layer 76" contacts top surfaces of the ILD 40 and the isolation features 60. The SAC layer portions 76"s extend downward from the lower surface 76"b. The SAC layer portion 76"s of the low-k dielectric layer 76" contacts the gate electrode layer 44, the gate dielectric layer 42, the sidewall spacers 34'. In some instances, the SAC layer portions 76'/s is in contact with the conductive feature 70a.

The M-CESL portion 76"m of is similar to the M-CESL portion 76m in FIGS. 21A-E and 21A-E and the M-CESL portion 76'm of FIG. 24. Each conductive feature 70a, 70b has a portion 70m embedded in the M-CESL portion 76"m of the low-k dielectric layer 76". The M-CESL portion 76"m of the low-k dielectric layer 76" is in contact with the ILD layer 40, the isolation feature 60, the CESL 38, and the sidewall spacers 34' at the lower surface 76"b, as shown in FIG. 26. An etch stop layer or an ILD layer may be subsequently formed over a top surface 76/'t of M-CESL portion 76"m to form subsequent structures, such as an interconnect structure.

Embodiments of the present disclosure provide various advantages over existing technology. For example, the conductive features according to the present disclosure are wider and shorter resulting in smaller resistance comprised the existing technology. Shorter conductive features also enable further shrinking in device size. By replacing a sacrificial self-aligned contact (SAC) layer and a sacrificial metal contact etch stop layer (M-CESL) with a low-k material, capacitance of the device is also reduced. As a result, performance of the device is improved.

It will be understood that not all advantages have been necessarily discussed herein, no particular advantage is required for all embodiments or examples, and other embodiments or examples may offer different advantages.

Some embodiments of the present provide a semiconductor device including an interlayer dielectric (ILD) layer, a first source/drain metal contact formed in the ILD layer, a low-k dielectric layer having a top surface and a lower surface, wherein the lower surface is in contact with the ILD layer, a first portion of the low-k dielectric layer extends upward from the lower surface, and a second portion of the low-k dielectric layer extends downward from the lower surface, and a conductive feature formed above the first source/drain metal contact, wherein a first portion of the conductive feature is embedded in the low-k dielectric layer, a second portion is embedded in the ILD layer, and the first portion is wider than the second portion.

Some embodiments of the present disclosure provide a semiconductor device including first and second source/drain features, first and second source/drain metal contacts formed above the first and second source/drain features, a gate electrode layer disposed between the first and second source/drain features, first and second sidewall spacers disposed between the gate electrode layer and the first and second source/drain metal contacts, a self-aligned contact (SAC) layer disposed above the gate electrode layer, wherein the SAC layer comprises a low-k dielectric material, a metal contact etch stop layer (M-CESL) disposed above the SAC layer; and, a conductive feature having a first portion embedded in the M-CESL layer and a second portion in contact with the first source/drain metal contact, and the first portion of the conductive feature is in contact with the SAC layer.

Some embodiments of the present disclosure provide a method for forming a semiconductor device. The method includes depositing a sacrificial metal contact etch stop layer (M-CESL) over a first interlayer dielectric layer (ILD) having a source/drain metal contact formed therein, wherein an isolation feature is formed above the source/drain metal contact, depositing a second ILD layer over the sacrificial M-CESL layer, forming a contact opening by patterning the second ILD layer and the sacrificial M-CESL layer, filling the contact opening with a conductive material, performing a planarization process to remove the second ILD layer and the conductive material in the ILD layer to expose the sacrificial M-CESL layer, removing the sacrificial M-CESL layer, and depositing a low-k dielectric layer to cover the conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:
   depositing a sacrificial metal contact etch stop layer (M-CESL) over a first interlayer dielectric layer (ILD) having a source/drain metal contact formed therein, wherein an isolation feature is formed above the source/drain metal contact;
   depositing a second ILD layer over the sacrificial M-CESL layer;
   forming a contact opening by patterning the second ILD layer and the sacrificial M-CESL layer;
   filling the contact opening with a conductive material;
   performing a planarization process to remove the second ILD layer and the conductive material in the second ILD layer to expose the sacrificial M-CESL layer;
   removing the sacrificial M-CESL layer; and
   depositing a low-k dielectric layer to cover the conductive material.

2. The method of claim 1, further comprising:
   forming a sacrificial self-aligned contact (SAC) layer over a gate electrode layer in the first ILD layer,
   wherein forming the contact opening comprises etching the isolation feature over the source/drain metal contact using the sacrificial SAC layer as an etch stop layer.

3. The method of claim 2, further comprising:
   removing the sacrificial SAC layer to form a cavity over the gate electrode layer.

4. The method of claim 3, wherein removing the sacrificial M-CESL layer and the sacrificial SAC layer are performed during the same etching process.

5. The method of claim 3, wherein depositing the low-k dielectric layer comprises filling the cavity over the gate electrode layer.

6. The method of claim 2, further comprising:
   depositing a metal gate liner over the gate electrode layer prior to forming the sacrificial SAC layer.

7. The method of claim 6, further comprising:
   etching sidewall spacers on both sides of the gate electrode layer prior to depositing the metal gate liner.

8. A method for forming a semiconductor device, comprising:
   depositing an interlayer dielectric (ILD) layer over first and second source/drain features;
   forming a first source/drain metal contact in the ILD layer and in contact with the first source/drain feature;
   etching back the first source/drain metal contact;
   depositing a first isolation feature over the first source/drain metal contact;
   depositing a sacrificial metal contact etch stop layer (M-CESL) over the first solation feature and ILD layer;
   patterning the sacrificial M-CESL and removing the first isolation feature;
   forming a conductive feature on the first source/drain metal contact, wherein a first portion of the conductive feature is embedded in the sacrificial M-CESL, a second portion of the conductive feature is embedded in the ILD layer, and the first portion is wider than the second portion; and
   replacing the sacrificial M-CESL with a low-k dielectric layer, wherein the low-k dielectric layer has having a top surface and a lower surface, the lower surface is in contact with the ILD layer, and a first portion of the low-k dielectric layer extends upward from the lower surface.

9. The method of claim 8, further comprising forming a gate electrode layer between the first and second source/drain features, wherein a second portion of the low-k dielectric layer is disposed over the gate electrode layer, and the second portion of the low-k dielectric layer extends downward from the lower surface.

10. The method of claim 9, further comprising:
    forming a sacrificial self-aligned contact (SAC) layer over the gate electrode layer and replacing the sacrificial SAC layer with the low-k dielectric layer.

11. The method of claim 10, further comprising:
    forming a metal gate liner over the gate electrode layer prior to forming the sacrificial SAC layer, wherein the metal gate liner is disposed over the second portion of the low-k dielectric layer and the gate electrode layer.

12. The method of claim 9, wherein the gate electrode layer is formed between two sidewall spacers, wherein the second portion of the low-k dielectric layer is disposed between the two sidewall spacers.

13. The method of claim 12, wherein the sidewall spacers are in contact with the low-k dielectric layer at the lower surface.

14. The method of claim 8, further comprising:
    forming a second source/drain metal contact in the ILD layer and in contact with the second source/drain feature; and
    forming a second isolation feature in contact with the second source/drain metal contact, wherein the lower surface of the low-k dielectric layer is in contact with the second isolation feature.

15. The method of claim 14, wherein the second isolation feature comprises a low-k dielectric material.

16. The method of claim 15, wherein the second isolation feature and the low-k dielectric layer are formed from the same low-k dielectric material.

17. A method for forming a semiconductor device, comprising:
    forming first and second source/drain features;
    depositing a first interlayer dielectric layer (ILD) over the first and second source/drain features;
    forming a gate electrode layer between the first and second source/drain features;
    forming a sacrificial self-aligned contact (SAC) layer above the gate electrode layer;
    forming first and second source/drain metal contacts above the first and second source/drain features and through the first ILD layer, wherein first and second sidewall spacers are disposed between the gate electrode layer and the first and second source/drain metal contacts;
    depositing a sacrificial metal contact etch stop layer (M-CESL) above the SAC layer;
    depositing a sacrificial ILD layer over the sacrificial M-CESL; and
    forming a conductive feature, wherein the conductive feature has a first portion embedded in the sacrificial M-CESL and a second portion in contact with the first source/drain metal contact, and the first portion of the conductive feature is in contact with the SAC layer;
    removing the sacrificial ILD layer;
    replacing the sacrificial M-CESL with a low-k dielectric material; and
    replacing the sacrificial SAC layer with the low-k dielectric material.

18. The method of claim 17, further comprising forming an isolation feature in contact with the second source/drain metal contact and the sacrificial M-CESL.

19. The method of claim 18, wherein the isolation feature comprises a low-k dielectric material.

20. The method of claim 17, further comprising:
   removing the sacrificial M-CESL layer and the sacrificial SAC layer during the same etching process.

\* \* \* \* \*